(12) United States Patent
Lal et al.

(10) Patent No.: US 11,867,754 B2
(45) Date of Patent: Jan. 9, 2024

(54) SONIC TESTING METHOD, APPARATUS AND APPLICATIONS

(71) Applicant: CORNELL UNIVERSITY, Ithaca, NY (US)

(72) Inventors: Amit Lal, Ithaca, NY (US); Christopher Batten, Ithaca, NY (US)

(73) Assignee: Cornell University, Ithaca, NY (US)

( * ) Notice: Subject to any disclaimer, the term of this patent is extended or adjusted under 35 U.S.C. 154(b) by 815 days.

(21) Appl. No.: 16/631,590

(22) PCT Filed: Jul. 17, 2018

(86) PCT No.: PCT/US2018/042371
§ 371 (c)(1),
(2) Date: Jan. 16, 2020

(87) PCT Pub. No.: WO2019/018328
PCT Pub. Date: Jan. 24, 2019

(65) Prior Publication Data
US 2020/0182930 A1 Jun. 11, 2020

Related U.S. Application Data

(60) Provisional application No. 62/533,390, filed on Jul. 17, 2017.

(51) Int. Cl.
*G01R 31/303* (2006.01)
*B06B 1/06* (2006.01)
(Continued)

(52) U.S. Cl.
CPC .......... *G01R 31/303* (2013.01); *B06B 1/0622* (2013.01); *G01N 29/00* (2013.01); *G01N 29/22* (2013.01); *G01N 29/225* (2013.01)

(58) Field of Classification Search
CPC .... G01R 31/303; B06B 1/0622; G01N 29/00; G01N 29/22; G01N 29/225; H01L 23/00;
(Continued)

(56) References Cited

U.S. PATENT DOCUMENTS

| 5,788,453 A | 8/1998 | Donde et al. |
| 7,029,950 B2 * | 4/2006 | Yonehara ............... H01L 24/83 438/113 |

(Continued)

FOREIGN PATENT DOCUMENTS

| CN | 103251425 | * 8/2013 | ............. G01N 29/24 |
| JP | 2013243668 | * 12/2013 | ........... B06B 1/0622 |
| WO | 2014014968 | 1/2014 | |

OTHER PUBLICATIONS

International Search Report and Written Opinion for International Application PCT/US2018/042371; dated Dec. 24, 2018; 10 pages.

*Primary Examiner* — Jacques M Saint Surin
(74) *Attorney, Agent, or Firm* — Barnes & Thornburg LLP

(57) ABSTRACT

A system, comprising: (i) an interposer layer; (ii) a circuit layer positioned on the interposer layer and comprising a plurality of sonically-enabled pads; and (iii) an interrogator layer positioned on the circuit layer and comprising a plurality of ultrasonic transducers configured to sonically interrogate the circuit layer; wherein the sonically-enabled pads are configured to generate an electrical signal in response to sonic interrogation from the interrogator layer, if the sonically-enabled pad is functional.

23 Claims, 24 Drawing Sheets

(51) Int. Cl.
  *G01N 29/22* (2006.01)
  *G01N 29/00* (2006.01)
(58) Field of Classification Search
  CPC ... H01L 2224/0401; H01L 2224/16227; H01L 2224/32145; H01L 2224/73265; H01L 2224/15311
  USPC .......................................................... 73/1.8
  See application file for complete search history.

(56) References Cited

U.S. PATENT DOCUMENTS

| | | | |
|---|---|---|---|
| 8,143,726 B2 * | 3/2012 | Knickerbocker | H01L 23/147 257/777 |
| 8,222,079 B2 * | 7/2012 | Knickerbocker | H01L 25/0652 438/108 |
| 8,405,226 B2 * | 3/2013 | Knickerbocker | H01L 23/5286 257/777 |
| 9,245,790 B2 * | 1/2016 | Thangaraju | H01L 23/528 |
| 10,200,016 B2 * | 2/2019 | Ayotte | H03K 3/0315 |
| 2005/0148132 A1 | 7/2005 | Wodnicki | |
| 2005/0156325 A1 | 7/2005 | Yang | |
| 2013/0020907 A1 | 1/2013 | Bernasseau et al. | |

* cited by examiner (a)

(a)

(b)

(c)

(c)

(d)

(b)

(c)

(d)

(a)

(v)

(c)

(d)

(a)

(b)

SONIC TESTING METHOD, APPARATUS AND APPLICATIONS

CROSS REFERENCE

This application is a U.S. National Phase filing of International Application No. PCT/US18/42371 filed Jul. 17, 2018, which claims priority to U.S. Provisional Patent Application No. 62/533,390, filed Jul. 17, 2017 and entitled "Sonic Testing Method, Apparatus, and Applications," the subject matter of each of which is herein incorporated by reference in its entirety.

GOVERNMENT FUNDING

This invention was made with Government support under contract N66001-12-C-2009. The United States Government has certain rights in the invention.

FIELD OF THE DISCLOSURE

The present disclosure is directed to methods and systems for testing integrated circuits (ICs), chips, chiplets, and/or wafers consisting of an array of integrated circuit chips and, more particularly to methods and systems for testing chips ultrasonically without electrical connections.

BACKGROUND

Complementary metal-oxide-semiconductor (CMOS) circuits consist of various functional blocks such as SRAM cells, DRAM cells, and memory cells, among many others. Transistors form the basis of these functional blocks, and one or more faults in a transistor, interconnects, or the insulating layers that isolate the components, can render parts of an integrated circuit (IC), or even entire IC chips, useless. Accordingly, the ability to quickly and easily identify faults can save semiconductor companies millions of dollars every year, and can accelerate the time-to-market of new technologies. Additionally, in some implementations, many ICs are attached upside down to a separate substrate with the I/O ports not accessible to electrical contact based probes, which makes testing a challenge.

The cost of current systems is greatly increased by non-recurring engineering cost of assembling and designing systems with new chips that differ significantly from past chips in both chip I/O configuration and performance in power and heat generation. In the commercial world, the non-recurring engineering (NRE) costs can be absorbed over very large market segments in electronics. In military/defense applications, in contrast, the device and system counts are very low, the NRE costs of advanced electronics systems prohibitive and time to development too long; this sometimes prevents the military from operating with the highest performing systems.

SUMMARY

It would be beneficial and advantageous to have the capability for chips to be tested using ultrasonic communications channels to locations on chips without the need for electrical connections, and to have the capability to properly align chips on a substrate.

According to one embodiment of the disclosure are sonically enabled PADS (SEPADS) which are electrical connection pads with integrated circuitry to complement ESD protection, with added capability to convey information on the electrical parameters using ultrasonic communications. In order to communicate to the SEPADS, an AlN pixel array that is driven by an external array of RF delay and phase drivers can be used.

One non-limiting object is to enable a sonically-enhanced testing framework. Another non-limiting object is to use off-the-shelf electronics (Op-AMPS, CMOS switches, data converters) to implement sonically enabled I/O pads and test points using aluminum nitride (AlN) transducers on CMOS ICs. The technology can enable the following capabilities: (a) demonstrate measurement of DC and AC voltage on SEPADS and SETestPOINTS (Sonically Enabled Test Points); (b) demonstrate actuation of digital SEPADS with actuation triggered by sonical pulses detected at the SEPADs; (c) demonstrate sonic-channel based measurement of current flow through a PAD; (d) demonstrate scan test, BIST, and at-speed probing for an integer multiply/divide unit and SRAM block using RTL simulation.

Follow-on embodiments include: (a) demonstrating measurement of DC and AC voltage on a SEPAD; (b) demonstrating actuation of a digital pad with 100 MBits/s data rate to the channels; (c) demonstrating measurement of current flow through a VDD pin; (d) demonstrating scan test, BIST, and at-speed probing for an integer multiply/divide unit and SRAM block using sonic channels.

According to another aspect is a method and system for micro-manipulation based on bulk-PZT lateral bimorph technology to be placed at the end of a manipulator to pick up and place chiplets on an interposer, among other applications such as passives in MMIC RF pc-boards. According to an embodiment, integrated sensors on the micro-manipulator can be used to detect when the holder is encountering force while placing a chiplet on a surface.

According to another aspect is a method and system for alignment using ultrasonically active alignment marks. According to an embodiment, the alignment marks measure the reflectance of the ultrasonic energy, and once this energy is minimized, this indicates matching to the metal-to-metal layer transmission from the transmitter into the chip being connected. The bonding process can then be activated. Among other options, this bonding process can involve using vaporizable polymers to attach chips, and nano-solder pads deposited by electroplating to connect from one to another site. According to an embodiment, CMOS-enabled sonic alignment marks in an interposer are used to develop and/or work with micro-manipulator algorithms and recipes to place small chiplets onto designated spots on an interposer, among many other applications.

According to one aspect of the disclosure is a system comprising: (i) an interposer layer; (ii) a circuit layer positioned on the interposer layer and comprising a plurality of sonically-enabled pads; and (iii) an interrogator layer positioned on the circuit layer and comprising a plurality of ultrasonic transducers configured to sonically interrogate the circuit layer, wherein the sonically-enabled pads are configured to generate an electrical signal in response to sonic interrogation from the interrogator layer, if the sonically-enabled pad is functional.

According to an embodiment, the plurality of ultrasonic transducers are aluminum nitride piezoelectric transducers.

According to an embodiment, the interrogator layer is configured to test one or more of the plurality of sonically-enabled pads by sonically interrogating the circuit layer.

According to an embodiment, the interrogator layer is configured to monitor one or more of the plurality of sonically-enabled pads by sonically interrogating the circuit layer.

According to an embodiment, at least some of the plurality of ultrasonic transducers form a phased array.

According to an embodiment, at least some of the plurality of pads comprise a sonically-enabled test point.

According to an embodiment, the plurality of sonically enabled pads comprise integrated circuitry.

According to an embodiment, the sonic interrogator is attached to the circuit layer using a thin-film attachment.

According to an embodiment, the thin-film attachment is adhesive bonding.

According to an embodiment, the sonic interrogator is reversibly attached to the circuit layer using a vaporizable polymer.

According to an aspect is a method for testing a pad. The method includes: (i) providing an interrogator layer positioned on a circuit layer comprising a plurality of sonically-enabled pads, the interrogator layer comprising a plurality of ultrasonic transducers configured to sonically interrogate the circuit layer; (ii) sonically interrogating the circuit layer; and (iii) monitoring one or more of the sonically-enabled pads for an electrical signal generated in response to the sonic interrogation, wherein a generated electrical signal indicates that a sonically-enabled pad is functional.

According to an embodiment, the method further includes the step of attaching the sonic interrogator to the circuit layer using a thin-film attachment.

According to an embodiment, the thin-film attachment is adhesive bonding.

According to an embodiment, the method further includes the steps of attaching the sonic interrogator to the circuit layer using a vaporizable polymer; and heating the vaporizable polymer to at least the vaporizing temperature to vaporize the polymer and separate the sonic interrogator and the circuit layer.

According to an aspect is a system including: (i) a circuit layer comprising a plurality of alignment elements configured to respond to sonic interrogation; and (ii) an interposer layer comprising a plurality of ultrasonic transducers, at least some of the plurality of ultrasonic transducers positioned to align with a respective one of the plurality of alignment elements when the circuit layer is properly aligned, wherein the interposer layer is configured to: (1) sonically interrogate the circuit layer during alignment of the circuit layer; and (2) facilitate alignment by detecting a response of one or more of the alignment elements to the sonic interrogation.

According to an embodiment, the response of an alignments element is minimized when the alignment element and a transducer of the interposer layer are aligned.

According to an embodiment, the According to an aspect is an alignment method. The method includes: (i) providing an interrogator layer positioned respective to a circuit layer comprising a plurality of alignment elements configured to respond to sonic interrogation, the interrogator layer comprising a plurality of ultrasonic transducers configured to sonically interrogate the circuit layer, wherein at least some of the plurality of ultrasonic transducers positioned to align with a respective one of the plurality of alignment elements when the circuit layer is properly aligned; (ii) sonically interrogating the circuit layer during alignment of the circuit layer; and (iii) facilitating alignment by detecting a response of one or more of the alignment elements to the sonic interrogation.

According to an embodiment, the response of an alignments element is minimized when the alignment element and a transducer of the interposer layer are aligned.

According to an aspect is a system for manipulation. The system includes: (i) a PZT bimorph stage comprising a plurality of lateral PZT bimorph actuators each comprising a Z-cut groove configured to enable both in-plane and out-of-plane motion along three translational axes and about three rotational axes; and (ii) an elongated gripper comprising a first end attached to the PZT bimorph stage and second end configured to reversibly grip a chip or other circuit element, wherein movement of the PZT bimorph stage by a lateral PZT bimorph actuator moves the gripper.

According to an embodiment, the PZT bimorph stage is fabricated from a single piezoelectric substrate.

According to an embodiment, the system comprises two PZT bimorph stage each comprising an elongated gripper, wherein the second ends of the two elongated grippers are configured to cooperatively grip a chip or other circuit element. According to an embodiment, the second ends of the two elongated grippers are separated by approximately 50 μm to 1 mm.

According to an embodiment, the system comprises one or more integrated piezoresistive strain sensors configured to detect a holding force on the chip or other circuit element.

These and other aspects of the disclosure are disclosed and or envisioned by the accompanying figures and detailed description.

BRIEF DESCRIPTION OF THE DRAWINGS

The present invention will be more fully understood and appreciated by reading the following Detailed Description in conjunction with the accompanying drawings.

DETAILED DESCRIPTION

According to one embodiment of the disclosure are methods and systems for chip testing, alignment, and/or manipulation.

Chip Testing

According to one embodiment are sonically enabled PADS (SEPADS) which are IP pads with integrated circuitry to complement ESD protection. The system may implement, for example, sonically enabled I/O pads and test points using aluminum nitride (AlN) transducers.

According to an embodiment, integrated circuit chips are tested without electrical connections. This is accomplished using ultrasonic communications channels formed between the chip to be tested and a sonic interrogator chip attached to the backside of the chip or chiplet (reference to a chip or chiplet herein can refer to any of a wide variety of different chip or chip-like structures). The sonic interrogator chips are attached to the chiplets using conventional permanent thin-film attachments such as adhesive bonding. The system may also implement a reversible polymer bond using a vaporizable polymer that can be vaporized, without leaving any residue, for easy handling of the interrogator chip. The chip testing methodology can be scaled to conduct wafer-scale testing of dies. For example, a sonic interrogator wafer can be attached to the backside of a production run wafer using the vaporizable polymer as the adhesive layer. Just by connecting a few power lines to the test wafer, dies on the wafer can be tested to identify known-good-die.

Figure 1:
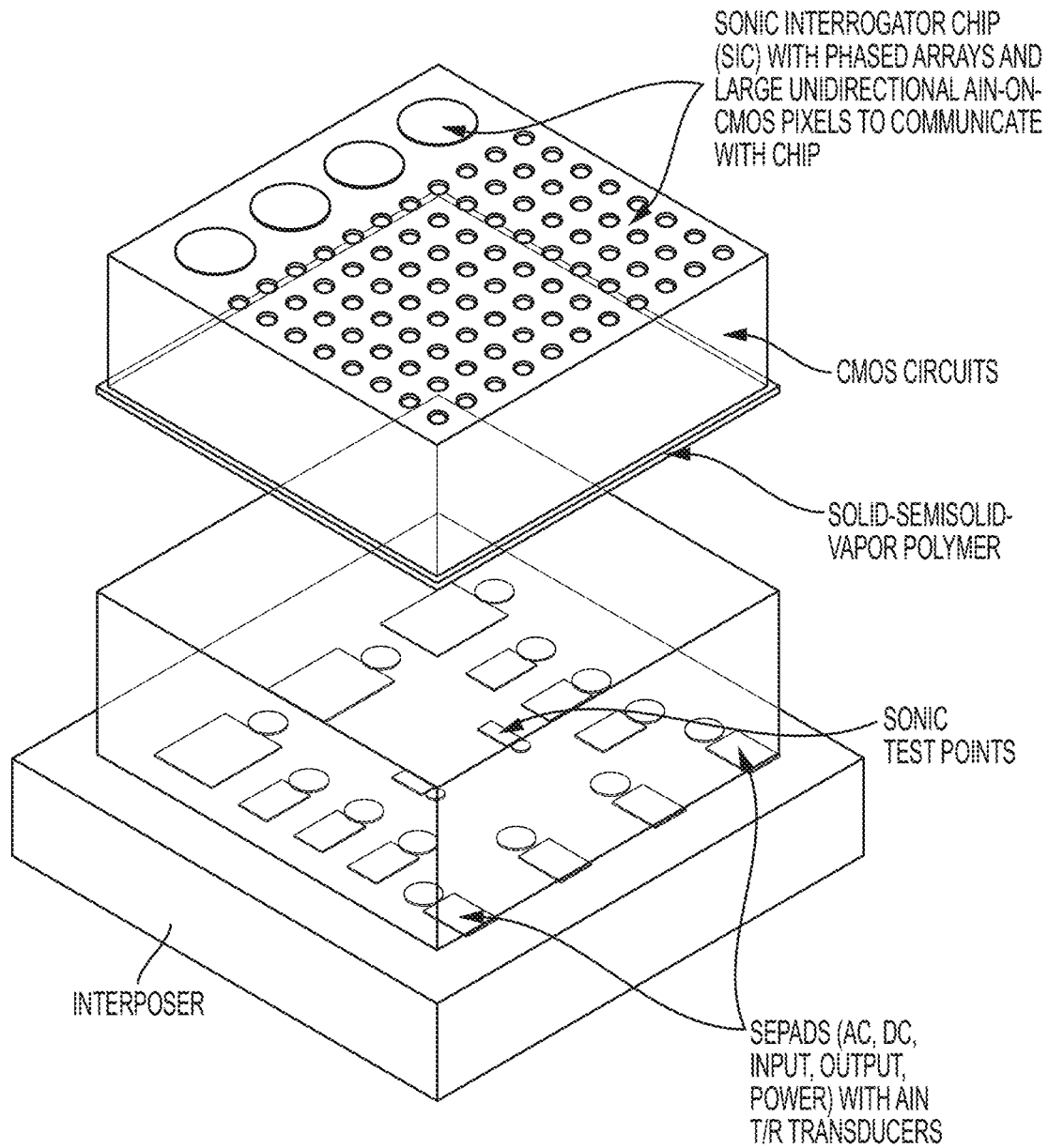
FIG. 1 is a schematic representation of a sonic-enabled testing system and methodology, in accordance with an embodiment.

Referring to FIG. 1, in one embodiment, is a depiction of the sonic-enabled testing system and methodology comprising gigahertz ultrasonic transducers made of sputtered thin-film AlN (Aluminum Nitride) piezoelectric transducers. AlN piezoelectric pixels on the SIC (Silicon Interrogator Chip) communicate to Sonically-Enabled PADs (SEPADS) on chiplets with ultrasonic communications capability. The piezoelectric transducers are driven by CMOS voltages of $1 V_{pp}$. The piezoelectric transducers are fully integrated onto the chiplets and interposers, so they can be interrogated by the interrogator chip using the ultrasonic communications channels. In addition to being used to test chips during assembly, the sonic interrogators can be permanently attached to serve as unique data paths and circuit monitoring sensors.

Figure 2:
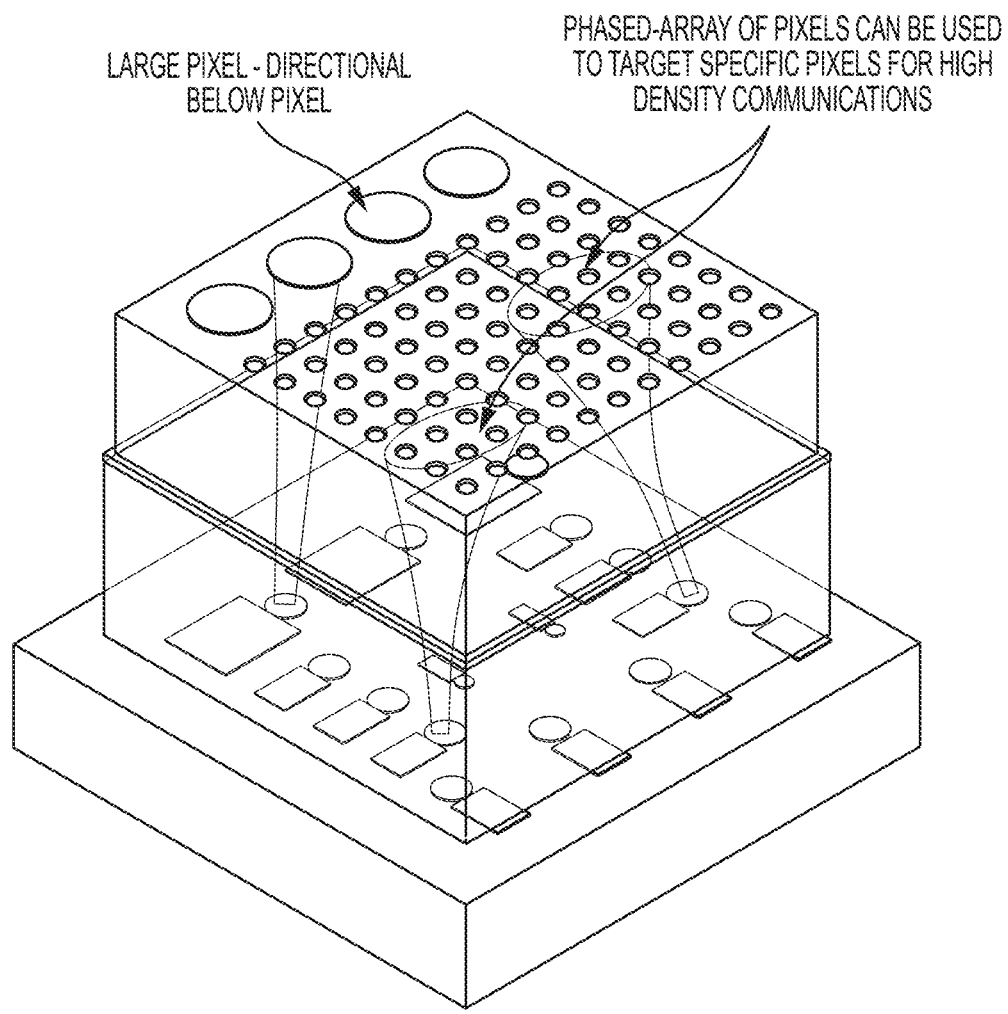
FIG. 2 is a schematic representation of phased-array and direct GHz ultrasonic communication between SIC and SEPADS on chiplets, in accordance with an embodiment.

Referring to FIG. 2, in one embodiment, is a schematic representation of phased-array and direct GHz ultrasonic communication between the SIC and SEPADS on chiplets, with an interposer base. The ultrasonic communication between the sonic interrogator chip and the chiplets and interposers would allow voltages to be applied, and voltages to be measured to test the chips. The ultrasonic arrays of transducers can be used to form a phased array to evaluate test sites as small as 1-4 µm in the middle of the chiplet, as shown in FIG. 2, enabling testing of sites that would otherwise not be possible. Non-phased array transducers can also be used to communicate to test sites below the transducers with a line-of-site channel. The communication links can be used to measure voltages and currents with high bandwidths corresponding to the ultrasonic carrier frequencies ranging from 2-GHz (0.18 µm CMOS) to 10-GHz (55 nm CMOS).

Thus, according to an embodiment the system comprises SEPAD (Sonically Enabled PAD) and SETPOINT (Sonic Enabled Test Point) technology for designers to utilize with interrogator chips. According to an embodiment are simple passive SETPOINTS in which the piezoelectric transducers are parasitically actuated to send signals. According to another embodiment are SEPADS with active circuits utilizing on-chip power to transduce currents and voltages onto the transmitted ultrasonic signal from the SEPAD. The SEPADS, in receive modes, can receive information from the interrogator to apply voltages to the electrical paths. The capability to measure and transduce voltages and currents at chip sites enables complete testing of signal paths for debugging of channels. Decisions on whether to keep a temporarily attached chiplet on a CHIPS substrate can be made before the entire system is put together. Combined with the sonic alignment and bonding approach described herein, the system enables robust microsystems based on chiplet integration of unprecedented small sizes.

Chip Alignment

According to an embodiment is a system and method for alignment using ultrasonically active alignment marks. According to an embodiment, the alignment marks measure the reflectance of the ultrasonic energy, and once this energy is minimized, this indicates matching to the metal-to-metal layer transmission from the transmitter into the chip being connected. The bonding process can then be activated.

Figure 3:
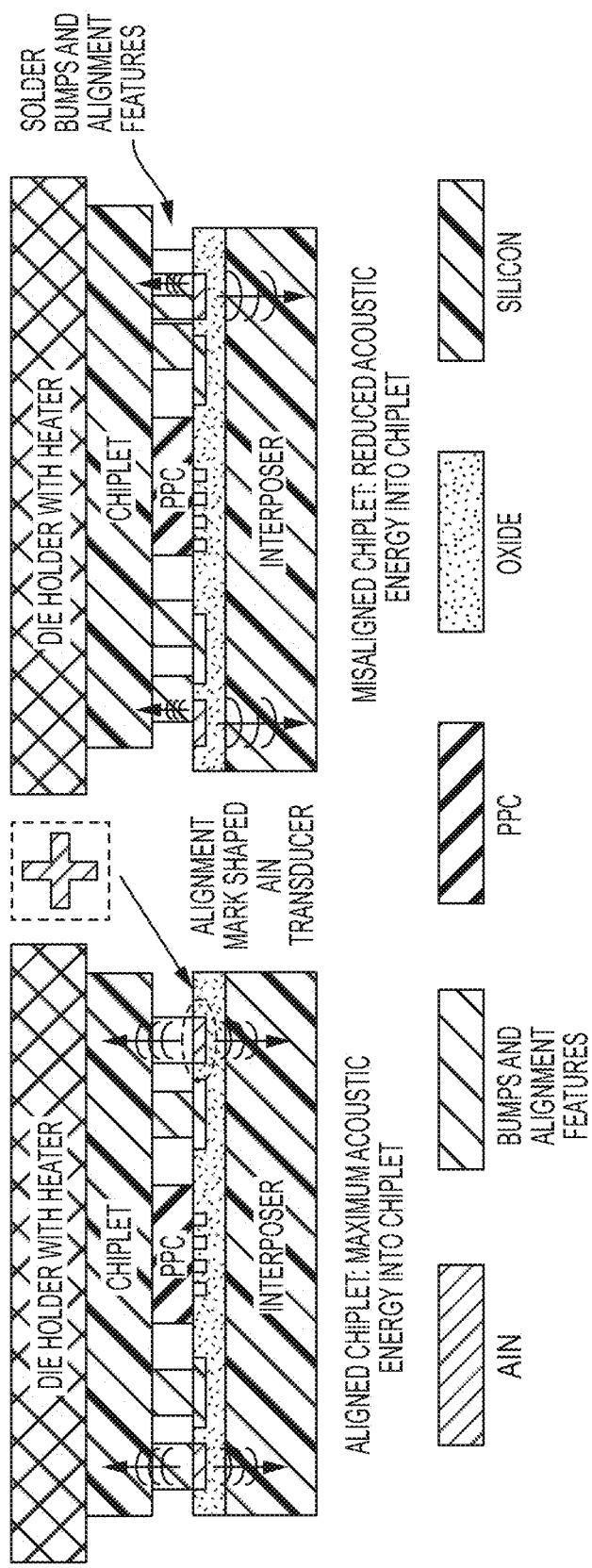
FIG. 3 is a schematic representation of alignment using ultrasonically active alignment marks, in accordance with an embodiment.

Referring to FIG. 3, in one embodiment, is a schematic representation of alignment using ultrasonically active alignment marks. Aluminum Nitride transducers in the interposer are used to generate acoustic waves. If the alignment features are above the transducer, as in the chip alignment in the left panel of FIG. 3, these waves will propagate into the CMOS chiplet and maximum energy will be transmitted when the alignment feature is exactly on top of the transducer. If the structures are misaligned, as in the chip alignment in the right panel of FIG. 3, these waves will bounce back toward the interposer and there is reduced acoustic energy transmitted into the chiplet.

According to one chip embodiment, very small chiplets, perhaps as small as lateral cross-section of ≈100×100 µm chips should be able to be placed and bonded onto an interposer. For small-function circuit elements, such as a state-of-art mixer, PLL, memory handler, or accelerator chip, the total chip area can be much larger than the space occupied by the transistor component of the circuit, owing to the large size taken up by the I/O pads. The pads not only increase chip space and chip cost, but also increase parasitics. A key challenge to increasing the IO density is to decrease pad size, and perform high resolution alignment between I/O pads on an interposer layer to the attached IC. State-of-the-art interconnect densities consist of pads down to 20 µm. Smaller sizes than these are prohibitive due to alignment tolerances in chip-to-chip bonding technologies, especially for very small chips. In order to solve these problems, described herein is a method and system utilizing sonic alignment marks, optionally facilitated by reversible polymer based bonding.

According to an embodiment, the sonic alignment marks eliminate the need for optical alignment. The chips can be aligned using the chip sonic touch sense property of the two surfaces enabling bonding and alignment in extremely tight volumes where traditional optical systems cannot be used, such as that shown in FIG. 3. Ultrasonically active alignment marks look like metal alignment marks but can vibrate at GHz frequencies. Interposer alignment marks can be active and turned-on during the alignment process. The intensity of GHz vibration amplitude of each alignment mark can be a function of the energy loss to the attached surface. The vibration amplitude, measured using the current being used to drive the transducer at a fixed voltage level, can be minimized when the counter alignment mark on the chiplet is aligned directly onto the interposer active mark. Once the interposer and chiplet are aligned, then the bonding can occur by heating the die. The acoustic importance response of the pulses can also be used to identify the temperature of the chip to provide feedback control over temperature distribution over the interposer.

Chip Manipulation

According to an embodiment is a system and method for micro-manipulation based on bulk-PZT lateral bimorph technology to be placed at the end of a manipulator to pick up and place chiplets on an interposer, among other applications.

Figure 4:
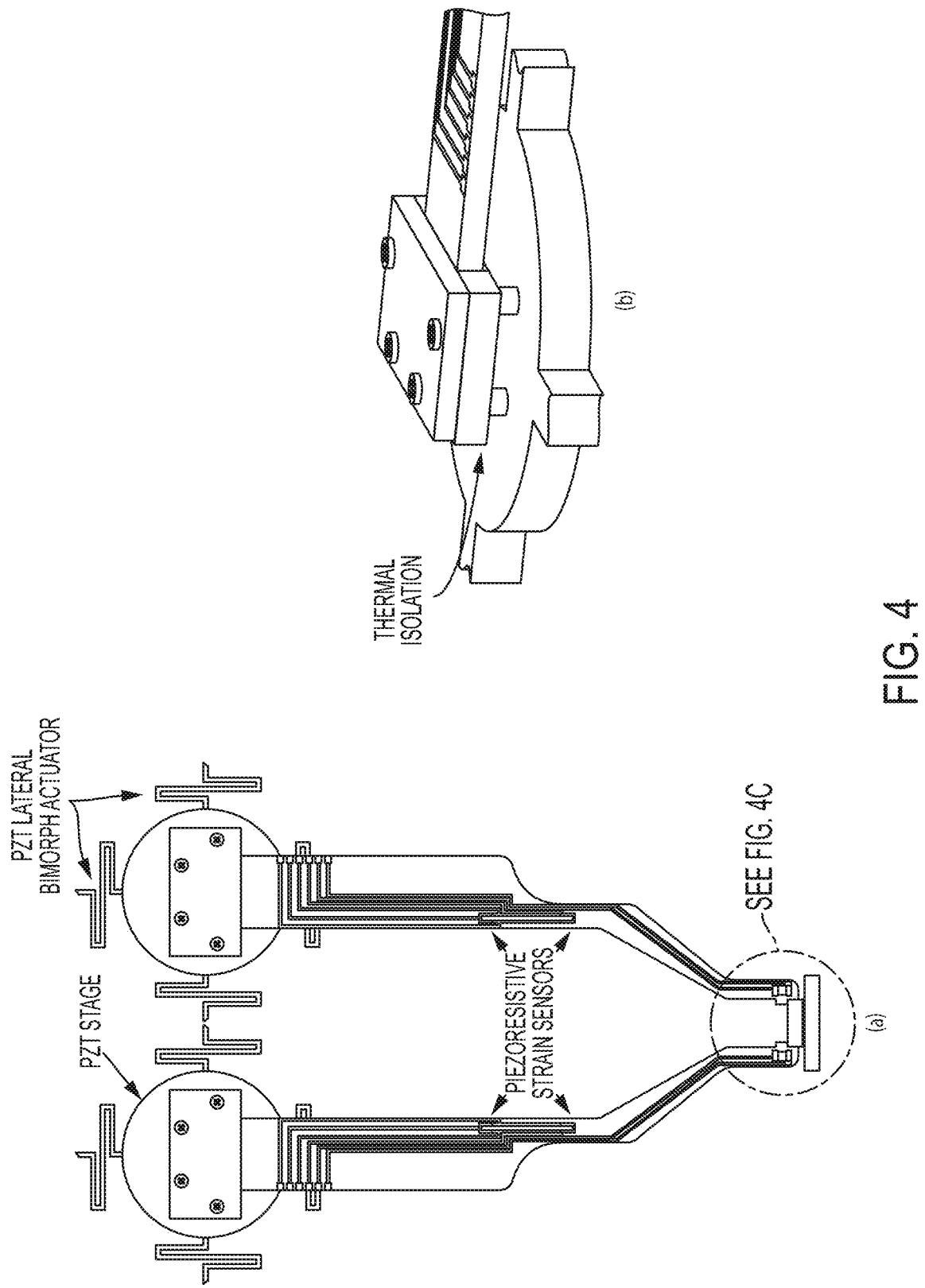
FIG. 4 is a schematic representation of a micro-manipulator, in accordance with an embodiment.
Figure 4:
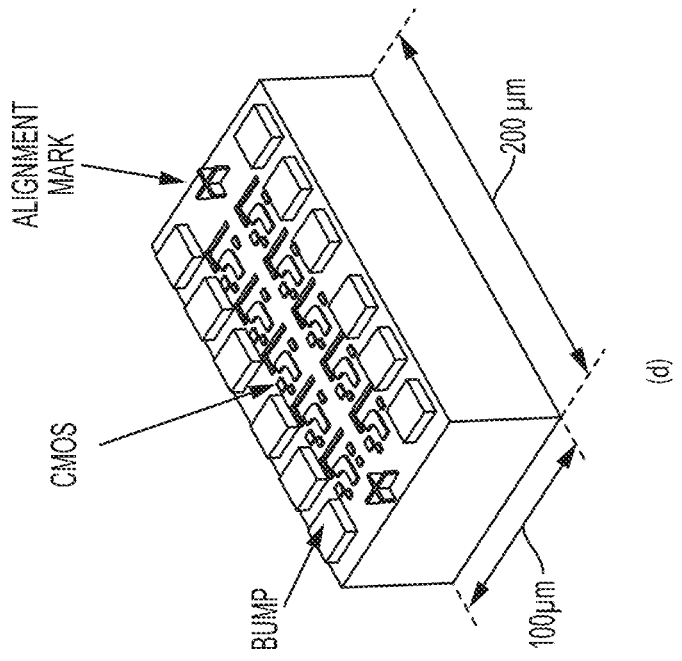
Figure 4:
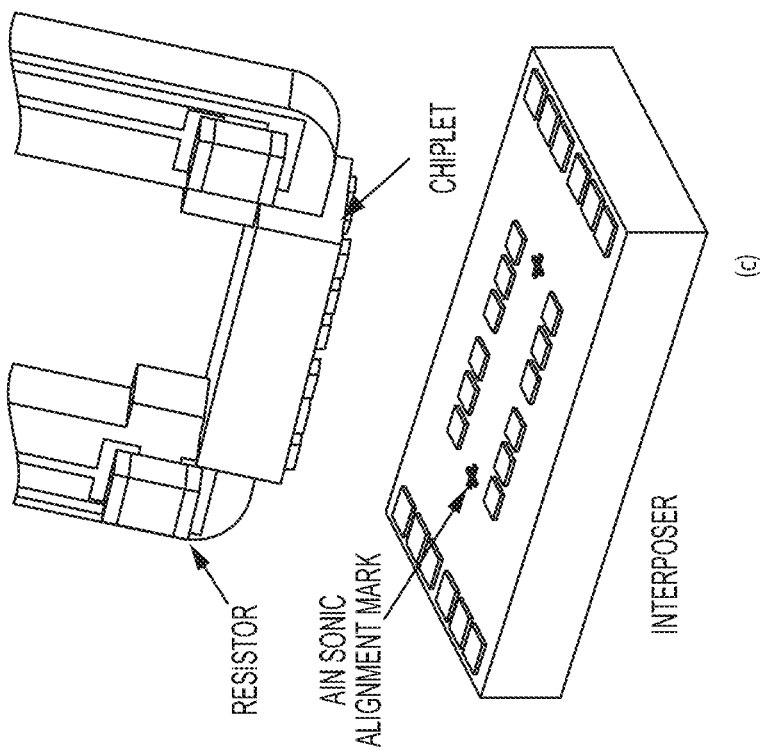

Very small chiplets require sub-mm handling tools. The chiplet handler described herein utilizes the novel lateral PZT piezoelectric bimorph actuator technology developed by the inventors and set forth in detail in prior and co-pending applications. Laser cut PZT plates enable monolithically integrated PZT lateral motion bimorphs that can generate 10-100 milli-Newton forces. Each stage has 8 actuators on which applied voltages can generate linear translation and rotation of the central carrier section. Silicon micromachined handles are integrated which enable grippers that have openings of 50 μm to 1 mm and have 100 μm end-gripper widths such that the gripper can reach in the middle of the kerf widths to remove the chiplet from dicing tape, assisted by ultrasonic actuation of the grippers. The sub-mm handling micro grabber tool for CMOS chiplet handling and assembly to the interposer chip is actuated with PZT lateral bimorph actuators as shown in FIG. 4. FIG. 4, panel (a) shows a sketch of the gripper with integrated polysilicon piezoresistive strain sensors and attached resistive heaters. The strain gauges are used to feedback control of the holding force on the chiplet. The gripper handles are micromachined using DRIE process on a silicon substrate, where the polysilicon piezoresistive sensors and the metal connections are surface micromachined on silicon handles. FIG. 4, panel (b) shows a close-up view of silicon handle connection to the PZT stage, which precision machined on a ceramic with low thermal conductivity to reduce the thermal link to the stage. FIG. 4, panel (c) shows the alignment and assembly of a diced chiplet to an interposer chip using GHz AlN ultrasonic transducer. The AlN ultrasonic transducer design is identical to the counter alignment marks on the chiplets (FIG. 4, panel (d), and the current of the active transducers are the alignment feedback. After alignment, the resistive heaters enable bonding chiplet die to the interposer chip, the resistors are integrated close to the tip of gripper handles to improve local heat transfer.

Reversible Chip Bonding

According to an embodiment is a system and method for reversible chip bonding utilizing a vaporizable polymer. The AlN transducer response described herein can be used as a feedback to control the temperature of the chiplet. Once the aligned interposer and chiplet are thermally bonded, the grabber releases the CMOS chiplet after a final inspection by applying strain to confirm the bonding. A bonding technology is delivered that allows one to remove chiplets if they fail during the testing phase. Polymers are used which are solid at room temperature, flow at approximately 160-170° C., and is then turned into vapor when the temperature reaches 210° C. The polymers are electrosprayed onto a silicon substrate though shadow masks to form thin films on even small chiplets eliminating the need for spin-coating on small chiplets. Chiplets are used with islands of the polymers, such that after the sonic alignment is done, the chiplet is heated to flow the polymer. The polymer flows into micro-channels in the interposer due to surface tension forces. Once cooled, the chiplet adheres to the interposer. If for some reason the chiplet needs to be removed, for example if the chiplet is bad, the local temperature can be raised to 220° C. to vaporize the polymer, release the die, and leave no residue. In order to minimize cross-talk to neighboring chiplets, the heating is done using very local heating resistors close to the polymer location on the interposer.

DETAILED DESCRIPTION OF THE EMBODIMENTS

Figure 5:
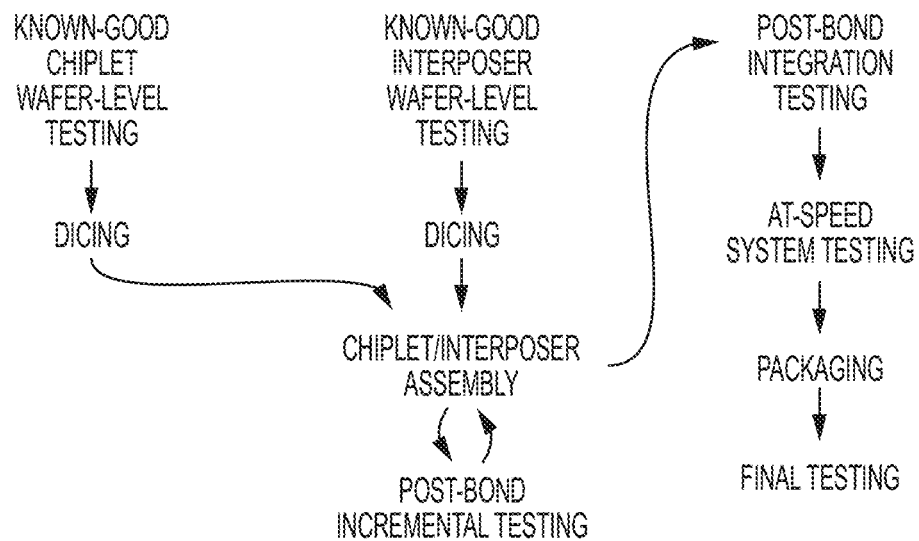
FIG. 5 is a flowchart of a testing and assembly flow for chip assembly and testing, in accordance with an embodiment.

Referring to FIG. 5 is an embodiment of a method for testing and assembly of a chip-based system ("CHIPS system"). According to an embodiment, known-good die wafer-level testing is used to identify working chiplets and interposers. Chiplet and interposer wafers are diced and then assembled together to create a CHIPS system. During the assembly process, post-bond incremental testing can be used to verify that each chiplet is still functional in-situ. Once the system is full assembled, post-bond integration testing can be used to verify that the link-level inter-chiplet interconnect and the higher-level inter-chiplet communication protocols are functional. At-speed system testing can be used to verify system-level functionality. Finally, the CHIPS system is packaged before undergoing traditional post-packaging final test.

Known-Good-Die Wafer-Level Testing—

Traditional integrated circuits use a combination of wafer-level testing (e.g., functional test of some or all dies using a probe card that contacts the bumps on a die before the wafer is diced) and final testing (e.g., functional and burn-in testing at high temperature and voltage of packaged parts using burn-in test sockets). Unfortunately, CHIPS systems face the known-good-die (KGD) problem: chiplets and interposers must be assembled before final testing, which means the bare-die chiplets and interposers must have the same quality and reliability as the equivalent packaged parts. While testing bare-die chiplets and interposers is possible (e.g., through temporary bare-die carriers), it can significantly increase the overall test cost. There has been a recent trend towards KGD wafer-level testing which combines various techniques including wafer-level burn-in and sophisticated statistical analysis with functional testing to ensure that the bare die are functional before assembly. However, several key challenges remain for KGD wafer-level testing: (1) contact-based probe-cards degrade the die bumps causing reliability issues, (2) high-frequency I/O interfaces are difficult to test using traditional probe cards, and (3) high-density micro-bumps make traditional probing very difficult.

Chiplet and Interposer Assembly—

Figure 6:
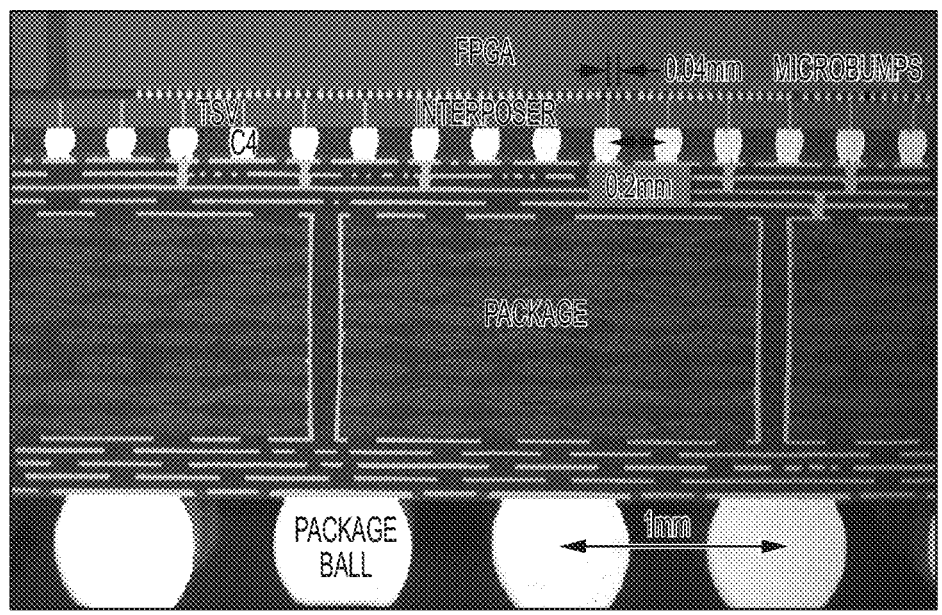
FIG. 6 is an image of a cross-section of a 2.5D assembly for a FPGA, in accordance with an embodiment.

Traditional 2.5D integration leverages high-density microbumps (e.g., approximately 10-20 µm diameter on 20-40 µm pitch) to bond chiplets to the silicon interposer (see FIG. 6). The interposer includes high-performance metallization layers very similar to the traditional CMOS BEOL stack as well as through-silicon vias (TSVs) to connect to low-density C4 bumps (e.g., approximately 100 µm diameter on 200 µm pitch) on the opposite side of the interposer for bonding to a traditional flip-chip BGA package. The CHIPS system typically requires a mix of both large and small chiplets. For example, small chiplets (e.g., on the scale of approximately 100×100 µm) might contain state-of-the-art RF mixers or PLLs. The area of these small chiplets is likely to be dominated by the micro-bumps, and this increases cost and parasitics. Decreasing the micro-bump size beyond the state-of-the-art is very challenging due to alignment tolerances in chip-to-chip bonding technologies and the need for sub-mm chiplet handling tools. Note that the assembly step might be non-reversible, meaning that a post-bond failure cannot be fixed by replacing a faulty chiplet.

Post-Bond Incremental Testing—

It would be ideal to test each chiplet after it has been bonded to the silicon interposer. This incremental testing is critical for verifying proper bonding and confirming the chiplet is still functional. Unfortunately, post-bond incremental testing can be particularly challenging since the system is not full assembled and there is no way to probe the buried microbumps. Even ignoring these challenges, the sheer number of transistors on larger chiplets and the comparatively limited amount of external I/O necessitate very slow scan-based testing techniques which increase test time and thus test cost.

Post-Bond Integration Testing—

Once most or all chiplets in the system have been bonded, it would be ideal to test the link-level inter-chiplet interconnect (e.g., driver circuitry→output pad→microbump→intra-interposer wiring→microbump→input pad→receiver circuitry) as well as higher-level inter-chiplet communication protocols. As with post-bond incremental testing, micro-bumps make this challenging due to limited post-bond controllability and observability. Furthermore, one must be careful that failures in a portion of the interposer and/or a single chiplet do not prevent full testing since system-level fault tolerance techniques can enable partially functional CHIPS systems to still be deployed.

At-Speed System Testing—

Traditionally, testing up until this point is almost always "low-speed" meaning the system is running at lower clock rates and/or lower throughput. As a final functional test, it would be ideal to test the full system "at-speed", but this can be challenging mostly because it is simply not possible to cost-effectively observe a large number of external I/O and/or internal signals when they are running at high speeds.

According to an embodiment, one approach to addressing some of these challenges in testing and assembling CHIPS systems is to leverage chip-scale wireless interfaces based on capacitive coupling, inductive coupling, or RF signaling.

Capacitive Coupling:

A chiplet can potentially communicate with the interposer or be interrogated for testing using capacitively coupled interconnect. Two chips are placed face-to-face such that matching top-layer metal pads are carefully aligned on both chips creating a parallel-plate capacitor which can be used for non-contact signaling. Unfortunately, this approach has several challenges in the context of the CHIPS program including the need for precise multi-axes alignment (particularly Z alignment), but perhaps more importantly capacitive coupling does not enable interrogating signals from the back-side of the chiplet which precludes using this approach for post-bond or at-speed chiplet testing. It is also not clear how effective capacitive coupling would be in known-good-interposer wafer-level testing since interposers are usually purely passive and thus would lack the necessary differential circuitry to amplify weak capacitively coupled signals.

Inductive Coupling:

It is also possible to use a pair of top-metal-layer coils to essentially act as transformers for inductive communication between two chips. These inductors can be face-to-face as with capacitive coupling, but it may also be able to perform back-side testing. Unfortunately, the corresponding pad pitch and transmit power increases significantly when inductively coupling across longer distances.

RF Signaling:—

A final approach is to use on-chip RF antennas to communicate wirelessly at multi-GHz frequencies. While this approach may enable back-side testing, the wavelength is very long at GHz frequencies necessitating excessive amounts of coding and/or complex high-power circuits to enable more than just a few channels.

Using GHz Ultrasonic Waves for CHIPS Testing, Assembly, and Bonding

In view of the above, described or otherwise envisioned herein is an approach, optionally called "SALTED-CHIPS" which utilizes ultrasonic waves to implement non-contact interfaces with a focus on testing, assembly, and bonding. GHz ultrasonic waves as a mode of energy and information is a great fit for CMOS integration and for CHIPS including reasons described below:

1. Wave packet length and wafer thickness: The wavelength of ultrasonic waves at 1 GHz is 9 µm, and is progressively smaller at higher frequencies. Pulse trains of 10-1-5 wavelengths are ≈90 µm, which is smaller than the silicon wafer thickness, allowing pulse-packets to bounce from the backside of the silicon and scatter before the next packet arrives.

2. Beam widths: scale as the wavelength of ultrasound, in the µm range allowing focusing with phased array approaches. This is in contrast with using RF methodologies in which the wavelength at even very high frequencies are very much larger than the chip size. This enables many channels to be used at once.

3. Arrays: The wavelength allows an array of λ/2 pixel arrays to be formed. These arrays can be formed on CMOS wafers owing to the low temperature processing. In addition, the approach does not require a release step under the AlN piezoelectric layer. AlN thin films are now used in many commercial devices including piezoelectric RF FBAR filters.

4. CMOS compatible voltage: The strain generated across a transducer is $$\varepsilon = d_{33} \frac{V}{t_{AlN}},$$

where $d_{33}$ is the piezoelectric coefficient. The thickness of the AlN film is approximately equal to half wavelength $$\left(\lambda/2 = \frac{C_{AlN}}{2f}\right)$$

at the center ultrasonic frequency. In the terms of the frequency f, one can write the strain as $$\varepsilon = d_{33}\frac{C_{AlN}}{2f}.$$

As is apparent from this expression, as frequency is increased, the voltage V can be reduced for keeping the excited strain the same across frequency. The previous results demonstrate use of 1 to 3 $V_{peak}$ to achieve the results on communications, TSV, and fingerprint imaging.

5. Electronics versus Transducer space: The electronics needed to drive the transducers can be integrated within the pixel area, for a highly integrated transducer/electronics subsystem. As the transistor sizes shrink at higher CMOS nodes decreasing circuit sizes quadratically, while the GHz ultrasonic wavelength scales inversely to first power of frequency. It has previously been demonstrated that almost all transducer electronics can be placed within the same area as the pixel size.

6. Low Loss: The silicon wafer itself has an ultralow loss, near-loss free.

7. Effect of CMOS stack on Ultrasonic Waves: The top CMOS layer including the metal stack is typically 9-10 μm thick, which is on the same size scale as sonic wavelength. Since the transducers are intimately in contact with the top metal and transistor stack. Any effect of diffraction due to metal and oxide placement is averaged out in the far-field.

The SALTED-CHIPS effort targets microsystems with different test vehicles that prove the viability of sonic testing, attachment, and bonding approaches. According to an embodiment the technology can be scaled to state of art 14 nm CMOS without loss of generality, and during the CHIPS program there may be an opportunity to work with the other teams working with 14 nm CMOS circuits.

Figure 7:
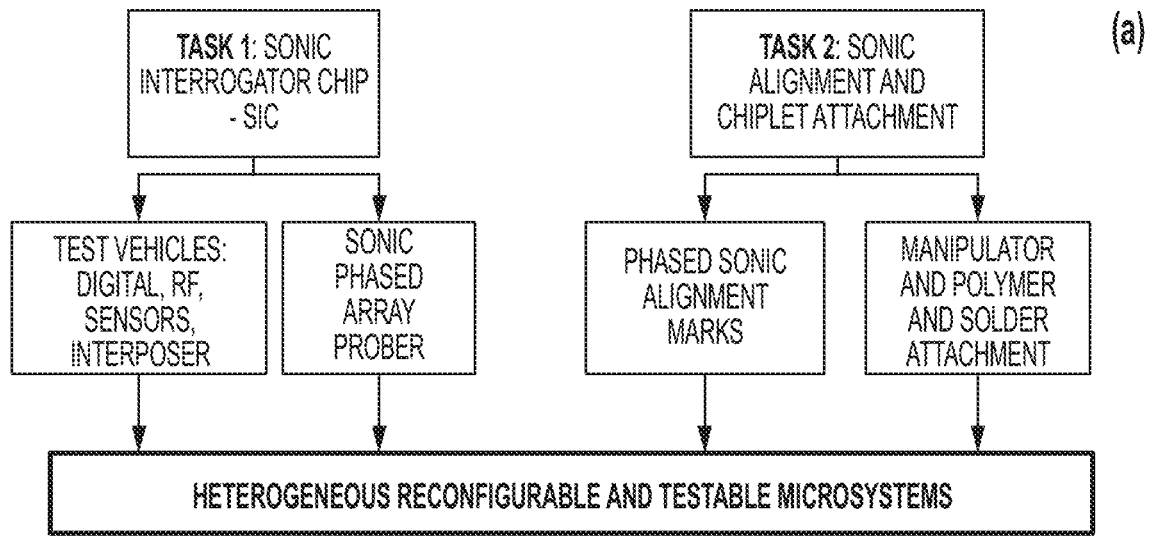
FIG. 7 is a schematic representation of a SALTED-CHIPS effort, in accordance with an embodiment.
Figure 7:
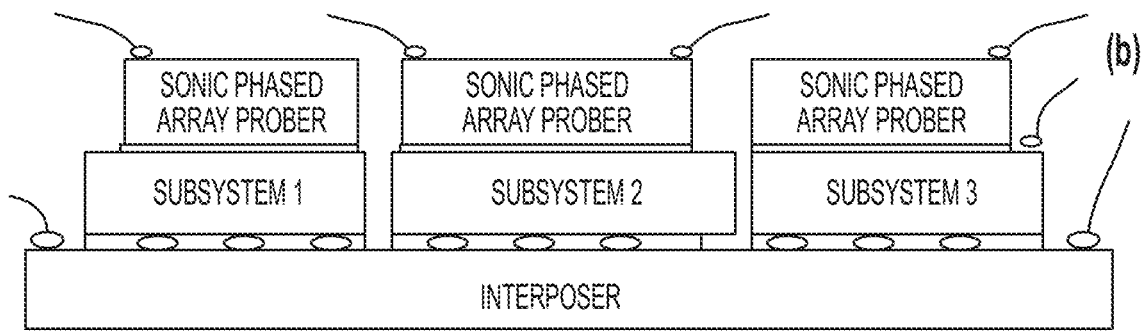
Figure 7:
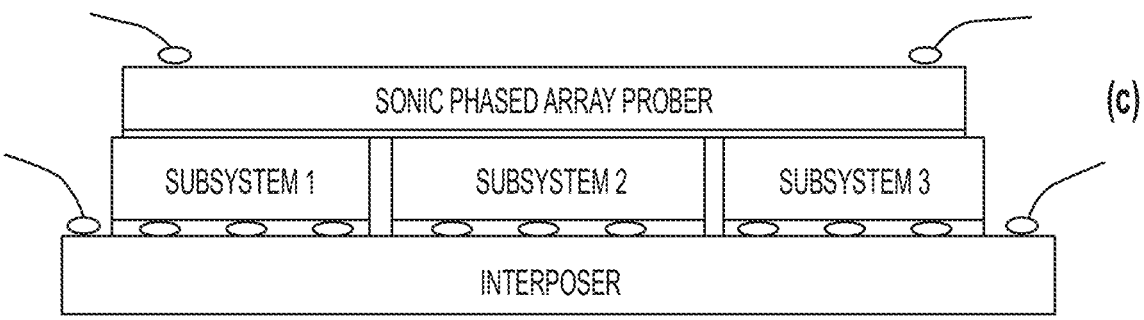

Referring to FIG. 7 is a schematic representation of a SALTED-CHIPS effort. In FIG. 7(a), task 1 focuses on Sonic Interrogator Chips framework under which a phased array sonar chip is used to test and interrogate test vehicles. These test vehicles include digital and analog circuits. Task 2 focuses on fine chip-to-chip alignment using active ultrasonic alignment marks, and manipulator to attach the chip. FIG. 7(b) shows a CHIPS system with SIC chip attached to each chiplet attached to interposer. Wirebonding are shown to connect each chip to the package, although flip-chip bonding and other kinds of wiring can also be used. In FIG. 7(c), one large SIC can be connected to several heterogeneous function chips that can be not only tested, but connected across using sonic readouts of the signals.

Sonic Enabled Testing

According to an embodiment, the first task consists of enabling the ability to measure and apply voltages onto IC PADs from the backside of the die using a Sonic Interrogator Chip (SIC). SIC consists of a phased array of ultrasonic transducers which can scan a beam of ultrasound with high resolution and temporal bandwidth. This methodology addresses the issue with diagnosing connectivity and system problem by enabling testing the ultra-dense I/O environment where PADS cannot be accessed. This methodology can also be used to beam power to specific deeply buried chips that cannot be accessed by power lines.

Sonic Alignment and Bonding

A major challenge for CHIPs is to attach small chips with high density interconnects. This challenge is hard for chip-to-chip bonding due to the tool volume and handling required to position chips across from each other. The ultrasonic alignment technology detects when a micro-manipulator held chip has been placed precisely over the correct pads, and provide an automated method to attach the chip to an interposer. The microsystems are demonstrated using the developed technologies as seen in FIG. 7. An interposer chip onto which test vehicles, corresponding to different circuit designs, is attached. On top of these chips, SIC chips are placed either individually (FIG. 7(b)) or one large SIC over a collection of chips (FIG. 7(c)).

The table below describes how sonic enabled testing (SET) and sonic alignment and bonding (SAB) can solve the testing and packaging approach outlined above.

TABLE 1

| CHIPS Challenge | Sonic Enabled Testing (SET) | Sonic Alignment and Bonding (SAB) |
| --- | --- | --- |
| Known-Good-Die Wafer-Level Testing | Wafer-level SIC attachment to wafer backside with a few power connections on top | Vaporizable polymer needed to process wafer in dry environment and not leaving any residue |
| Chiplet and Interposer Assembly | Sonic testing of assembled chiplets to provide good chip data | Sonic alignment marks enable easily aligned chiplet alignment and bonding |
| Post-Bond Incremental Testing | Digital chips can be triggered to be tested with different input sequences | Reversible bonding enables easy exchange with new die |
| Post-Bond Integration Testing | Testing across different chiplets and interposers | Reversible bonding enables easy exchange with new die |
| At-Speed System Testing | Injection and measurement of signals at high speeds | Reversible bonding enables easy exchange with new die |

Ultrasonic Probing and Signal Application: Sonically Enabled PADS (SEPADS) and Sonically Enabled Test Points (SETPOINTS):

In the CHIPS paradigm, multiple layers of chips may be stacked on top of each other, in addition to having the base chip layer connected onto an interposer at the bottom of the system. I/O pads and test points are engineered such that they can transduce information ultrasonically. The SIC chip is able to obtain signals off SEPADS or SETPOINTS and also apply voltages on these SEPADS and SETPOINTS. According to an embodiment, the system includes adding thin film piezoelectric transducers and circuitry (for active SETPOINTS and SEPADS) around the periphery of the chip I/O pads.

Figure 8:
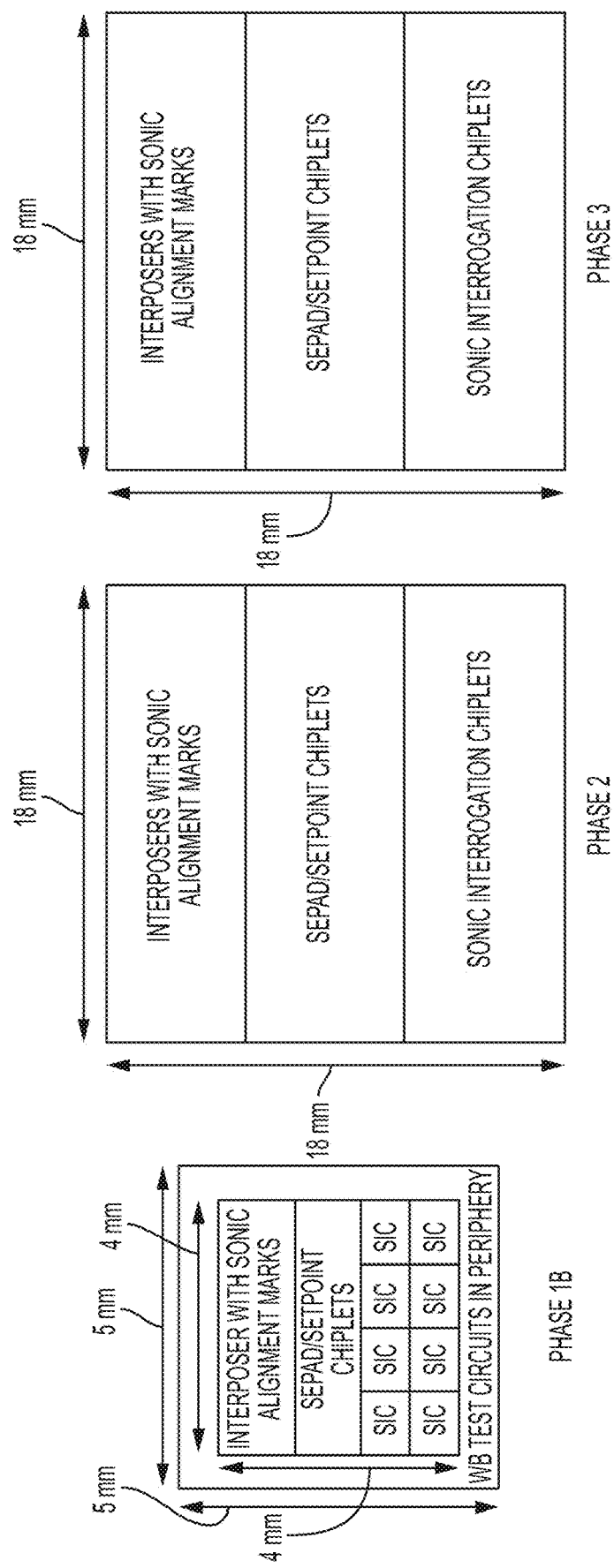
FIG. 8 is a schematic representation of AlN deposited on 5 mm×5 mm CMOS dies, in accordance with an embodiment.

Referring to FIG. 8 is a schematic representation of AlN deposited on 5 mm×5 mm CMOS dies. A 1 mm region around of the periphery is not covered with good quality AN as a result of the die level processing and is used for test circuits. FIG. 8 phases 2 and 3 illustrate dedicated CMOS runs with 18 mm×18 mm reticles, having AlN deposited over the whole reticle.

SEPADS of five types of I/O PADS are envisioned. Each PAD consists of circuitry to enable the piezoelectric AlN film layer to be both a transmitter and a receiver. Normally the sonic functionality is not active. When an ultrasonic signal from SIC transmits an interrogation code, the SEPAD is sonic-activated. SEPADs transmit DC and AC signals in both input or output modes. For input nodes, the incoming signal is used to generate a voltage that is applied to the PAD. For output nodes, the voltages at the PAD are transduced onto the transmitted signal. In addition, for system debugging, it is important to measure amplitude of current flowing into a power I/O such as $V_{DD}$ and GND, to determine if a circuit is short circuited. It is also possible to deliver power into an I/O pad by virtue of converting the incident sonic wave energy into electricity at the PAD site. This power is likely to be in the nanoWatt to µWatt level.

Experimentally, for transducers designed to operate at 1.3 GHz, approximately 10 mVpp of receive signal amplitude is obtained on a 50Ω resistor for every 1-Vpp applied electrically from a 50Ω source, when sending waves through 1.4 mm of silicon. This equates to 0.25 µW for every 2.5 mW applied. To increase the total amount of power received, a phased array of transducers can be used to obtain a power amplification proportional to the number of transducers in the array, it can be seen that for a linear array of N point sources spaced equal distances apart, the axial pressure in the center of the array is simply N times the pressure of a single point source.

TABLE 2

| I/O Type | Input | Output |
| --- | --- | --- |
| RF/AC, fast changing digital | AM/FM Sonic signal induce AC voltage on or current into PAD | AN pixel transmits voltages with FM/AM modulation |
| DC (bias voltages, power, signals) | AlN oscillator mixes with incoming signal and uses its amplitude/ frequency to generate a DC voltage into PAD | AlN oscillator signal is AM/FM modulated by PAD voltage and/or current and transmitted |
| Power | AC sonic energy can be used to generate DC power | $IV_{DD}$ is transduced and transmitted. |
| Test points | Transmit signal at point with FM/AM modulation | Receive signal at point with FM/AM modulation |

Figure 9:
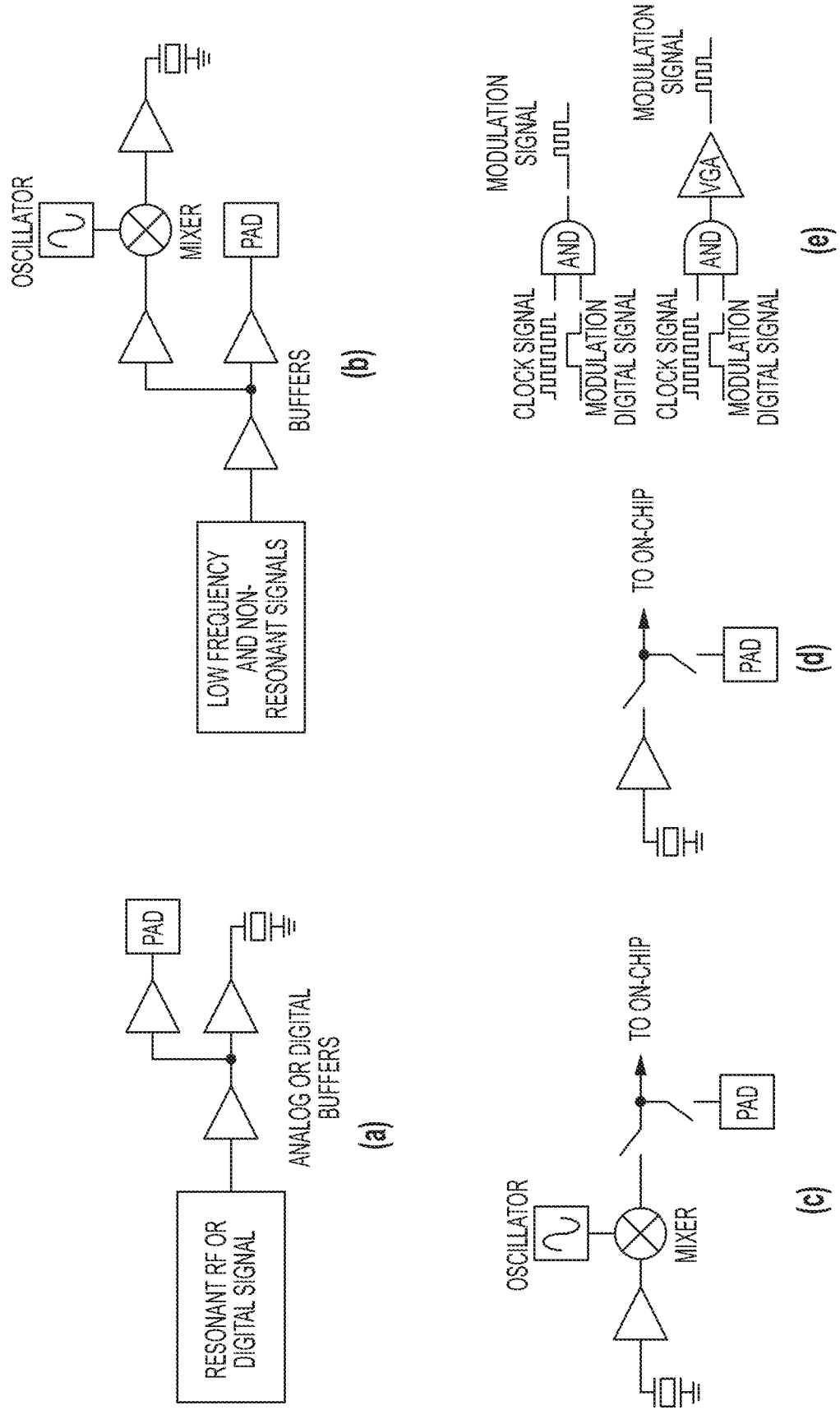
FIG. 9 is a schematic representation of possible circuits which can be implemented with SEPADS, in accordance with an embodiment.

According to an embodiment, the SEPADS require circuits that include (1) Receiver at sonic carrier frequency that depend on the technology node determined transistor fT, (2) transducer transmit driver, (3) envelope detector to down-convert signals, (4) baseband amplifiers, (5) digital circuits to detect mode command and sonic activation. Examples of how individual subcircuits can be combined to form the transmit/receive circuits necessary to realize SEPADS are shown in FIG. 9. It is estimated that these circuits to consume ~40×40 µm² area at 0.18 µm technology. With more advanced nodes these areas will decrease, but likely not by great margins owing to the analog nature of the circuits.

Referring to FIG. 9 are examples of possible circuits which can be implemented with SEPADS. FIG. 9(a) is for outputting RF analog or digital signals with frequency content in the transducer pass band, the transducer can simply be driven by the original signal through buffers. In FIG. 9(b), non-resonant output signals need to be modulated with a carrier frequency that is equivalent to the resonance frequency of the transducer. In FIG. 9(c), non-resonant input signals need to be modulated at a carrier frequency and therefore need to be demodulated to remove the original signal. An envelope/peak detector can be used in place of a mixer. In FIG. 9(d), resonant RF analog or digital signals can simply be recovered with an amplifier. In FIG. 9(e), a simple implementation of a transmit modulator can be used instead of a standard RF mixer.

Figure 10:
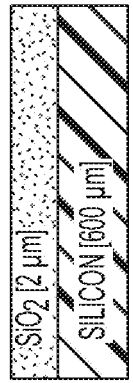
FIG. 10 is a schematic representation of wafer-level AlN processing, in accordance with an embodiment.
Figure 10:
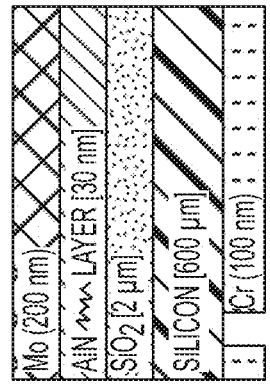
Figure 10:
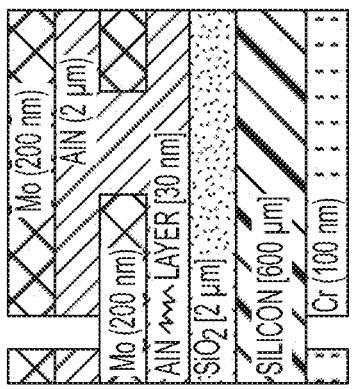
Figure 10:
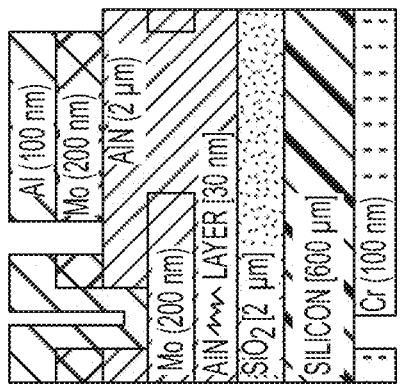
Figure 10:
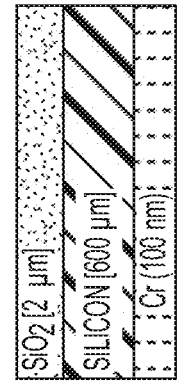
Figure 10:
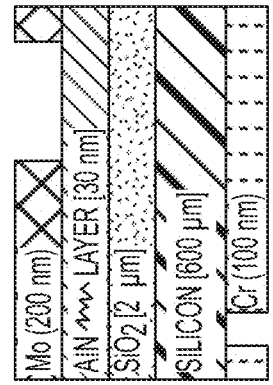
Figure 10:
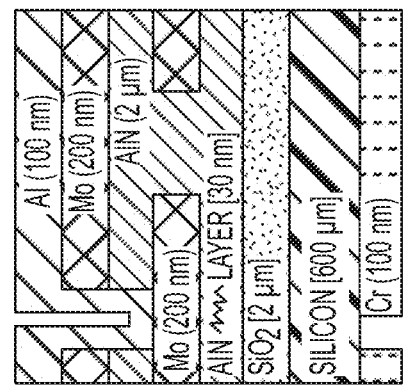
Figure 10:
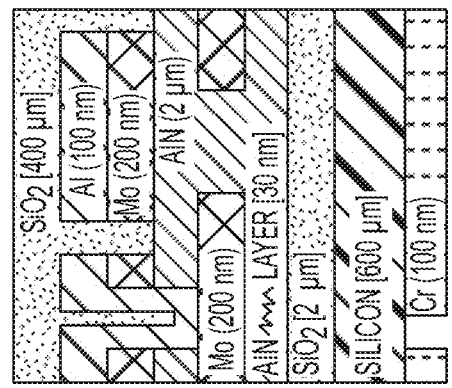
Figure 10:
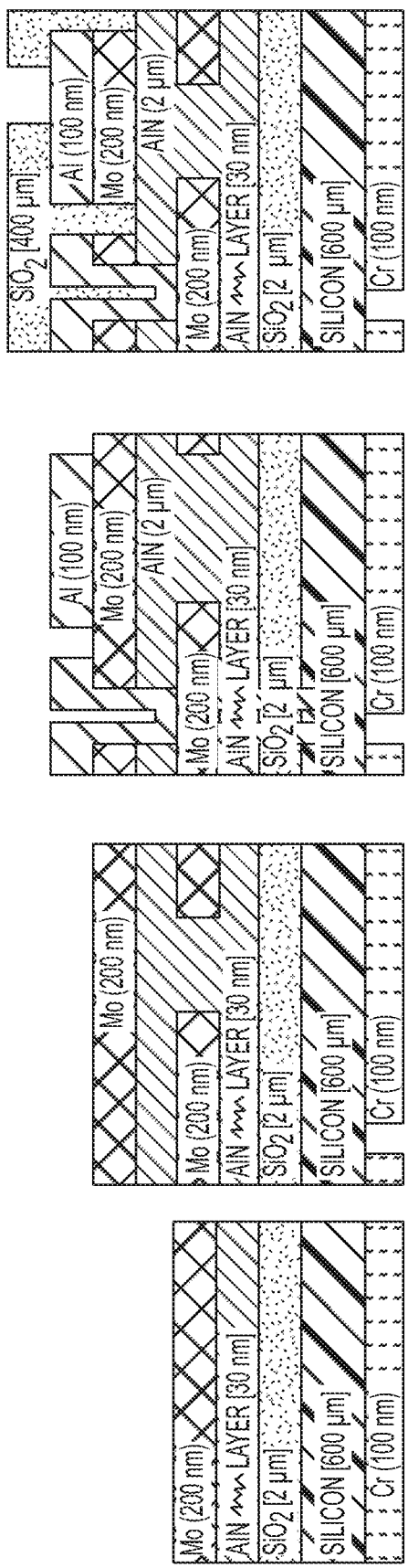
Figure 10:
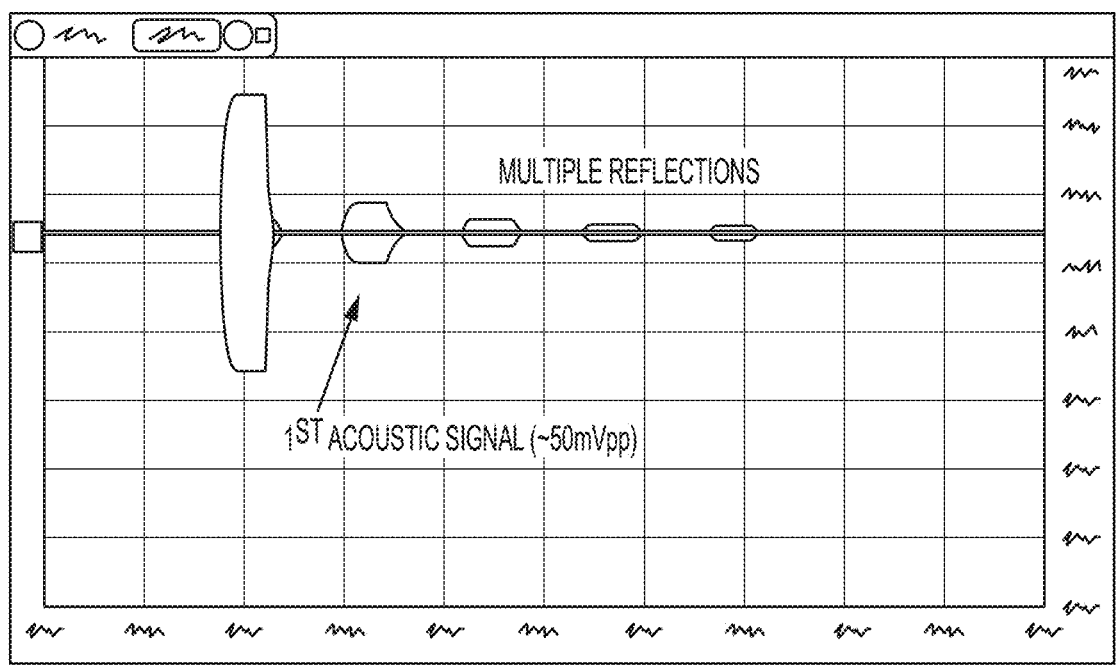
Figure 10:
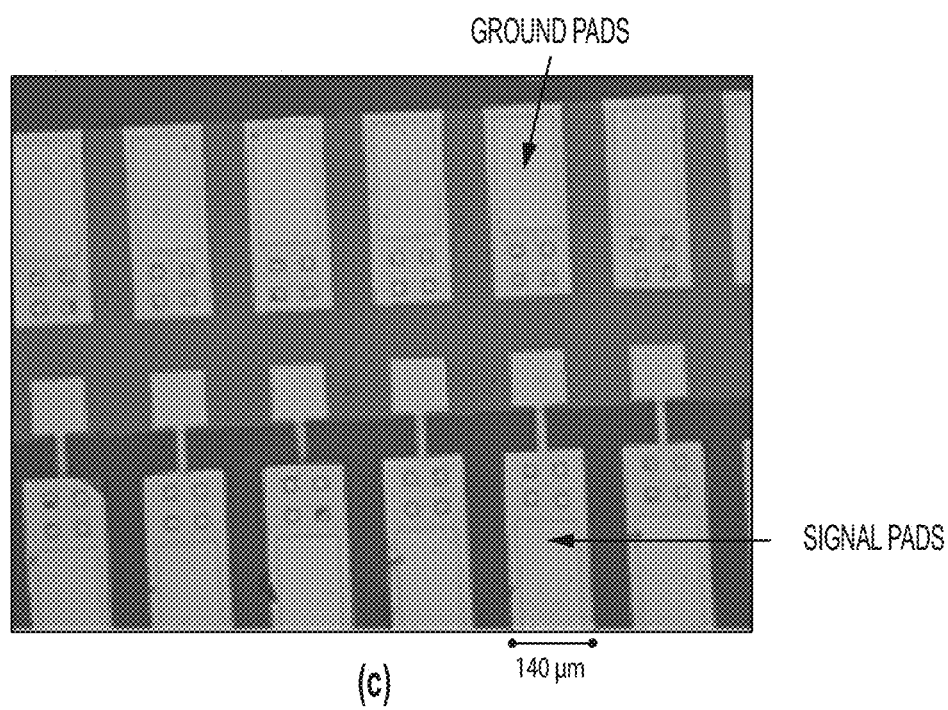

Off-Chip Electronics Drive of AlN Transducers:

According to an embodiment, AN transducers can be manufactured at waferscale, and can be driven by off-chip electronics and can be used to study the design and requirements of circuits in CMOS. For example, off-chip electronics drive currents and voltages can be scaled by knowing the parasitics introduced by off-chip connections. FIG. 10a shows the process for the AlN transducers developed by this group. FIG. 10b shows the transducer response for T/R indicating that one can get high quality transducers by combining thin film processing at one facility and AlN films deposited at OEM group.

Figure 11:
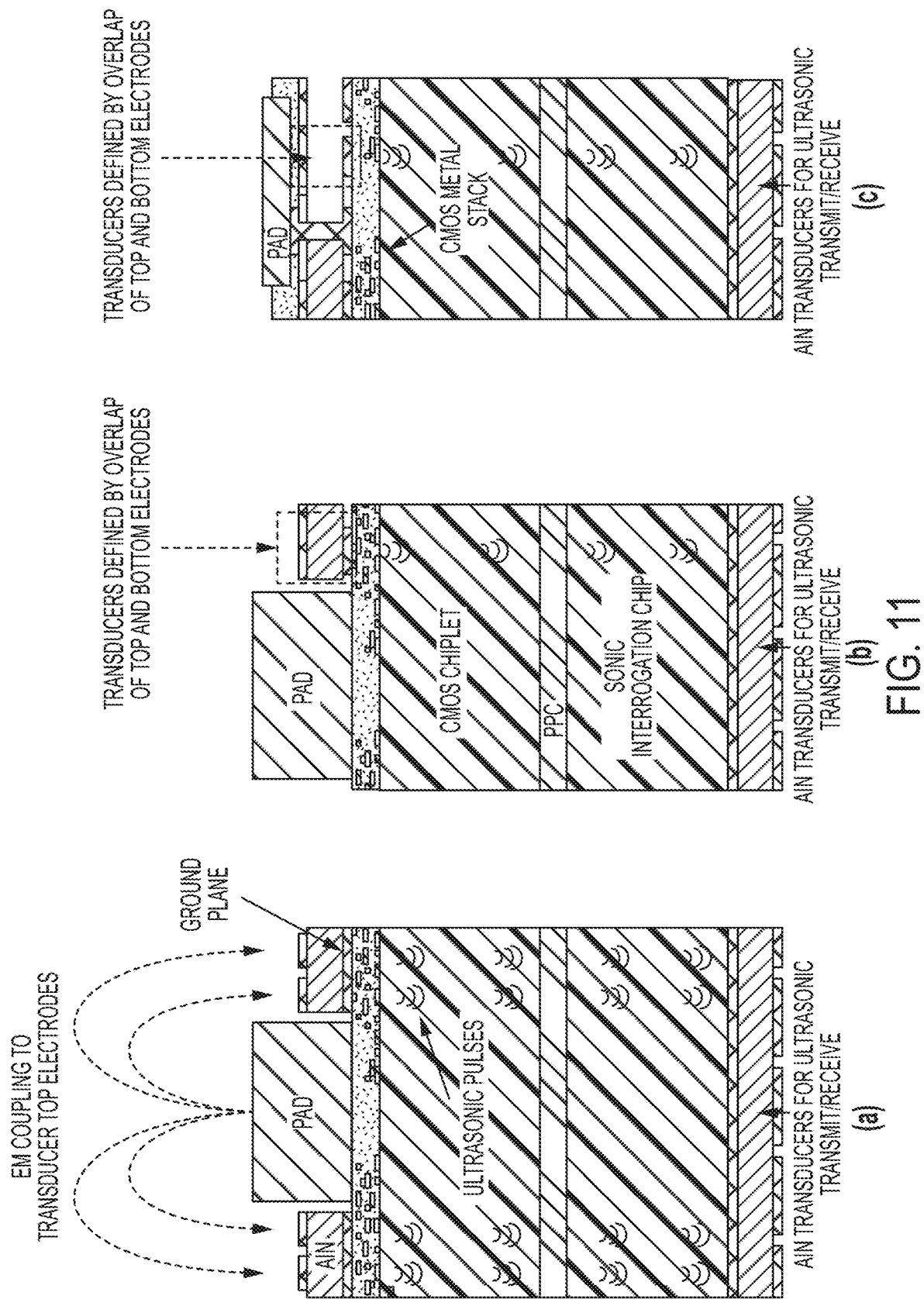
FIG. 11 is a schematic representation of three approaches to interfacing circuits to sound energy and process for integrating AlN on CMOS, in accordance with an embodiment.
Figure 11:
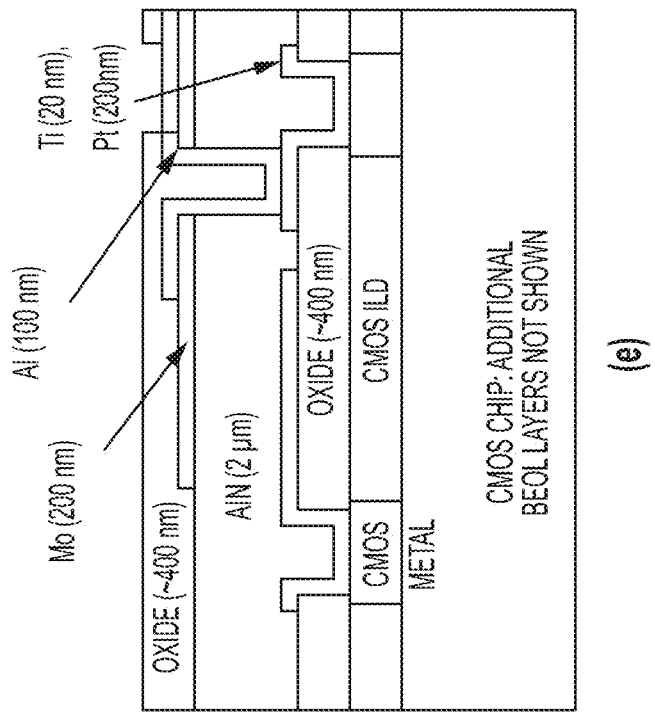
Figure 11:
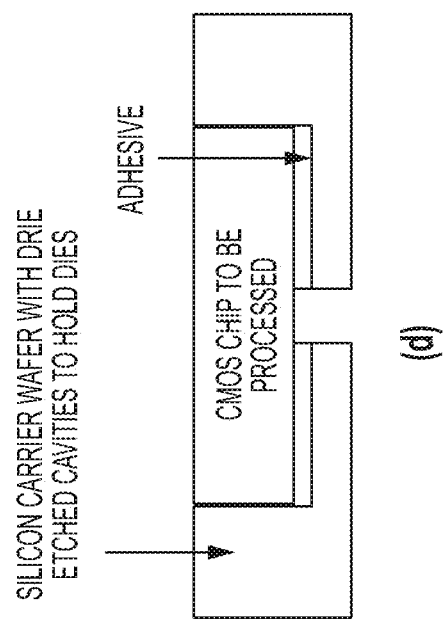

Technology for AlN Transducers on Top of IC:

According to an embodiment are methods for depositing AlN transducers to interface with CMOS circuits in the approaches shown in FIG. 11 (a,b,c). FIG. 11 comprises three approaches to interfacing circuits to sound energy and process for integrating AlN on CMOS to realize these approaches with die level processing. In FIG. 11(a), weak coupling achieved by parasitic electric field coupling from IO pads or metal traces to AlN transducers. In FIG. 11(b), deposition of AlN next to existing IO pads, but with direct integration with CMOS. In FIG. 11(c), transducers are fabricated underneath IO pads. In FIG. 11(d) is setup for die level cleanroom processing of AlN on CMOS dies with a carrier wafer. In FIG. 11(e) is a cross-section of film stack required to realize AlN transducers on CMOS chips.

Parasitic coupling of a metal wire or pad to adjacent transducer elements can be used to generate an ultrasonic pulse any time the particular wire/pad is excited electrically. Alternatively, direct connection to CMOS can be used for improved signal levels. A typical stack to be developed is shown in FIG. 11(e).

An oxide layer is deposited over the IC for isolation. A ground plane is deposited and patterned around the chip-pinout areas, consisting of a Ti/Pt film layer. This film stack ensures that the AlN device layer, which is deposited in the subsequent process step, grows with the appropriate crystalline orientation for the desired piezoelectric properties. The oxide layer should be patterned to allow for via connections to the CMOS stack if necessary. A top Mo electrode layer is deposited in the same vacuum cycle. An aluminum pad/via layer can be fabricated afterwards. An additional passivation oxide can be deposited on top to modify the frequency response of the stack.

Figure 12:
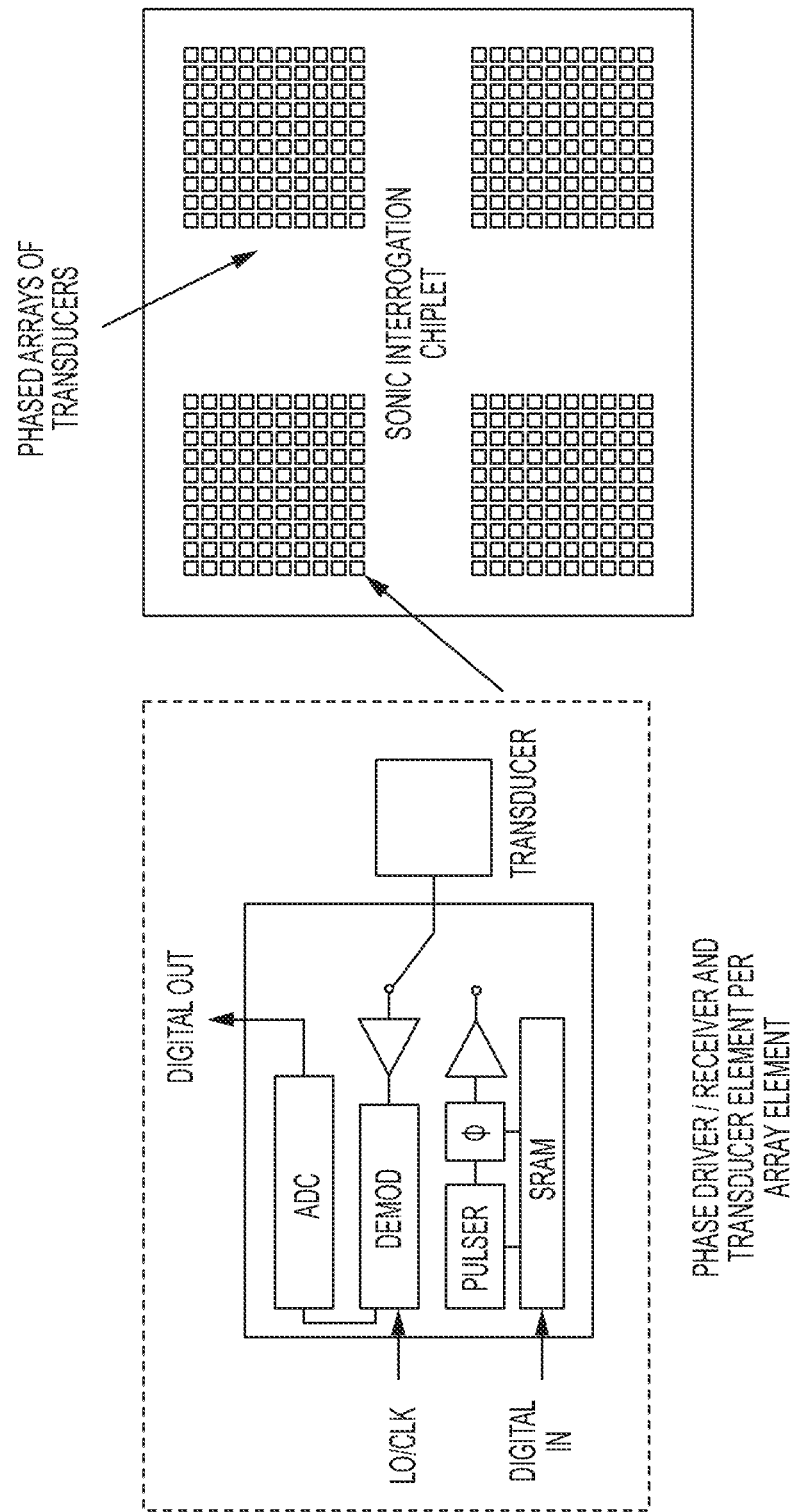
FIG. 12 is a schematic representation of a sonic interrogation chiplet using phased arrays of transducer pixels to probe a chip with a high frequency focused ultrasonic beam, in accordance with an embodiment.

Sonar Interrogator Chip (SIC):

According to an embodiment, the SIC consists of an array of AlN pixels, with amplification and mixing circuitry to receive pulses at gated signals. By controlling the gate delays on the received signals on each pixel, just as done in RADAR, these chips are able to triangulate to the signal of interest (FIG. 12). The GHz ultrasonic signals have wavelengths in the range of 9 µm to 2 µm for frequencies ranging from 1 GHz to 5 GHz, owing to the speed of sound in silicon being 9000 m/s. Since one can located objects with a timed gated SONAR with a beam of location with a spatial angular width of $$\Theta \sim 2 * \sin^{-1} \frac{1.391 * \lambda}{-\pi N d}.$$

The spatial resolution of the beam is the angular beam width times the distance to the target, which is typically 0.5 mm-0.8 mm.

For a 10×10 array of λ/2 pixels at 1-GHz (λ=9 μm), with N=10, for a 0.5 mm wafer, one can achieve a resolution of ~40 μm. The resolution can be increased by increasing the number of sampling pixels, and by increasing the frequency. The 10×10 array will take an overall area of ~100 μm×100 μm. More than one sensor array on the receiver chip can be used to focus onto different PADS. The circuit required to instrument each receiving pixel consists of an LNA, followed by a mixer to output a voltage corresponding to the cycle time of the PAD being characterized.

In addition to the listening of signals emitted, voltages can be injected onto pads by focusing the energy emitted by each pixel of an array onto the desired PAD area. The phased array increases the intensity of the strain wave incident on the piezoelectric AlN PADS as $I \sim N^2$ as the amplitude increases linearly and intensity increases as square of the amplitude. The voltages can be generated at resonance frequency and rectified to generate a voltage at the PAD. In effect this capability will also be a way to transfer energy remotely onto locations of circuits that are very hard to connect power lines.

A potential challenge to the SIC testing is that the sonic pulses generated might go through multiple reflections and result in data being read at different pixels. This problem is solved by two effects. Since the ultrasonic energy is focused onto a SEPAD, the reflected signals will have a very low probability of adding up in phase at any other site. Second, one can coat the chips with an absorptive material such as PVDF with metal nanoparticles. This materials has nearly the same acoustic impedance as that of silicon, allowing pulses to traverse it without significant reflection. The high density PVDF is able to then reduce the ultrasonic wave as its molecular high loss leads to conversion of the ultrasonic pulses into heat.

Figure 13:
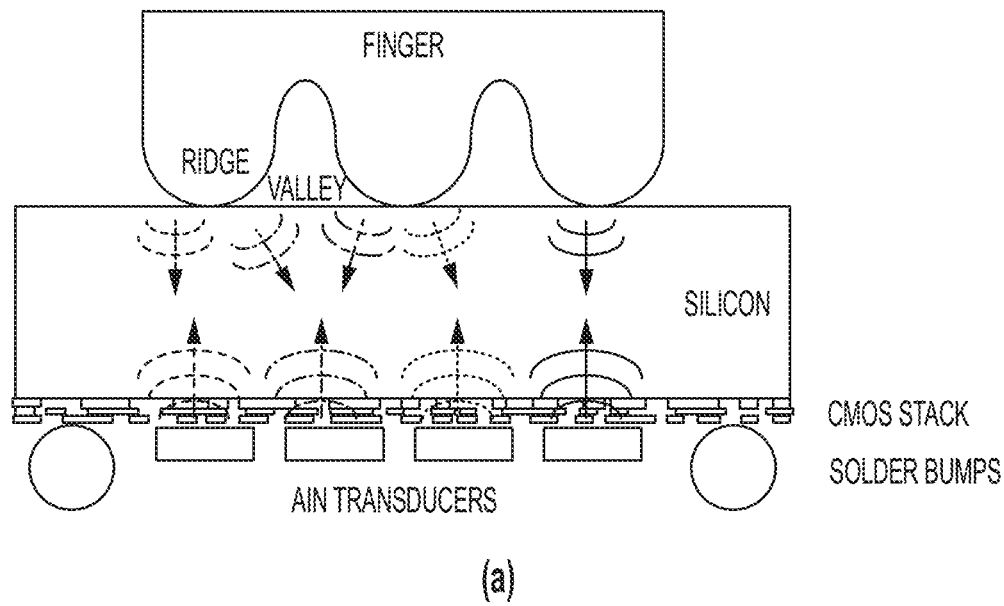
FIG. 13 is a schematic representation of fingerprint sensor using GHz ultrasonic pixel array, in accordance with an embodiment.
Figure 13:
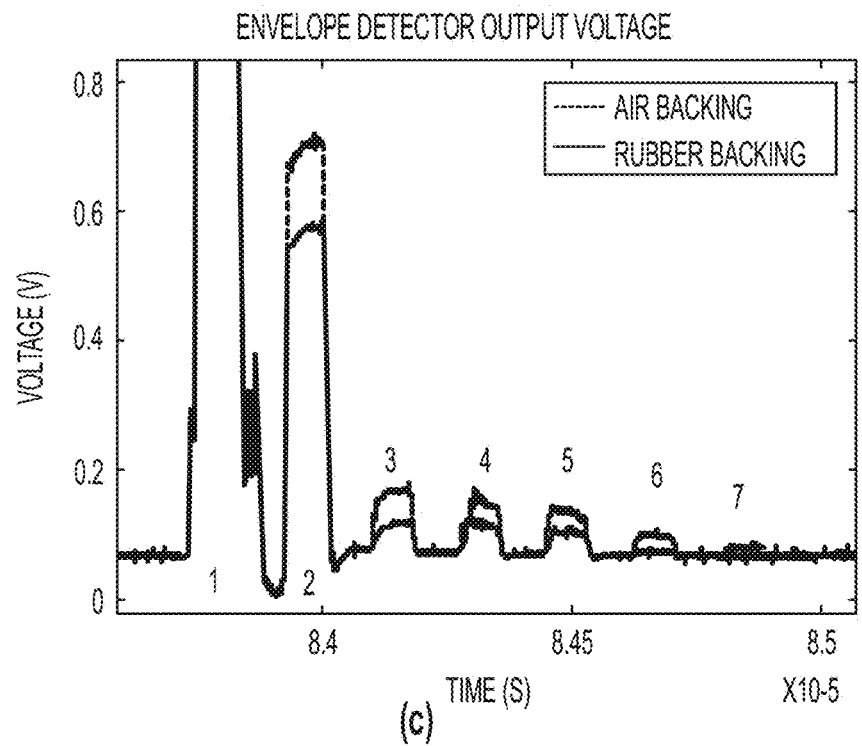
Figure 13:
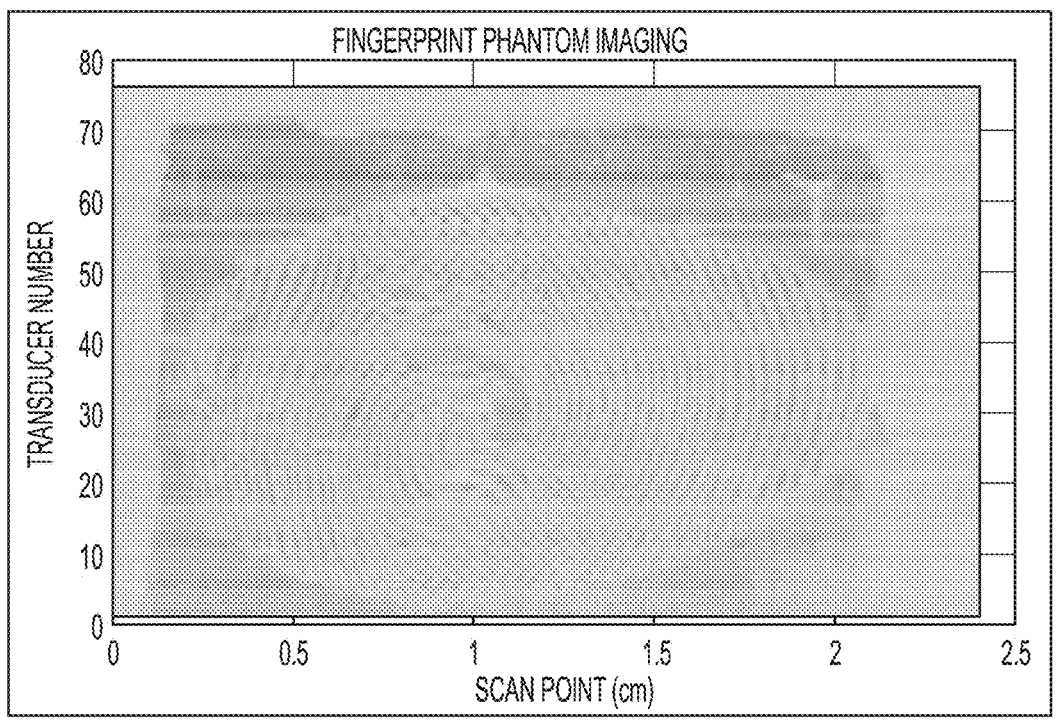

Sonic Alignment Marks:

For chip alignment, sonic pixels shaped in the shape of alignment marks can be used. The impetus for this idea comes from recent success in being able to gather fingerprints from the backside of a die with AlN transducers on the front side. As can be seen in FIG. 13, a finger with ridges and valleys when placed at the backside returns sonic signals with different amplitudes depending on whether tissue or air is present. For tissue, the ultrasonic impedance has a huge mismatch, and even with this mismatch one is able to image a fingerprint. In the case of alignment marks where the energy is coupled to a matched load, the effect on the transducer voltage is large and a strong function of the overlap of the alignment marks. By using alignment marks with X and Y asymmetry the alignment can be determined independently in X and Y axis. The SNR of transducer voltage measurement will determine the accuracy of alignment, and with a noise level of 20 mV, it is estimates that one can measure overall with uncertainty of 15 to 20 μm. For a matched alignment which diverts half of the total acoustic energy into the chiplet, as opposed to approximately 10 percent for a finger, one expects a SNR improvement of 4 to 5 times. This can be furthered increased by increasing transducer frequency for smaller acoustic wavelengths Referring to FIG. 13 is a schematic representation of a fingerprint sensor using GHz ultrasonic pixel array. In FIG. 13(a), sonic pulses launched are incident on fingerprint on backside where reflected signal is a function of tissue versus air. In FIG. 13(b) is 64 pixel linear array used with optimized AlN transducer stack. In FIG. 13(c), is a return signal shown for air backing versus that for a rubber imaging phantom with similar impedance to tissue. In FIG. 13(d), an imaged fingerprint provides resolution of 20 μm.

Figure 14:
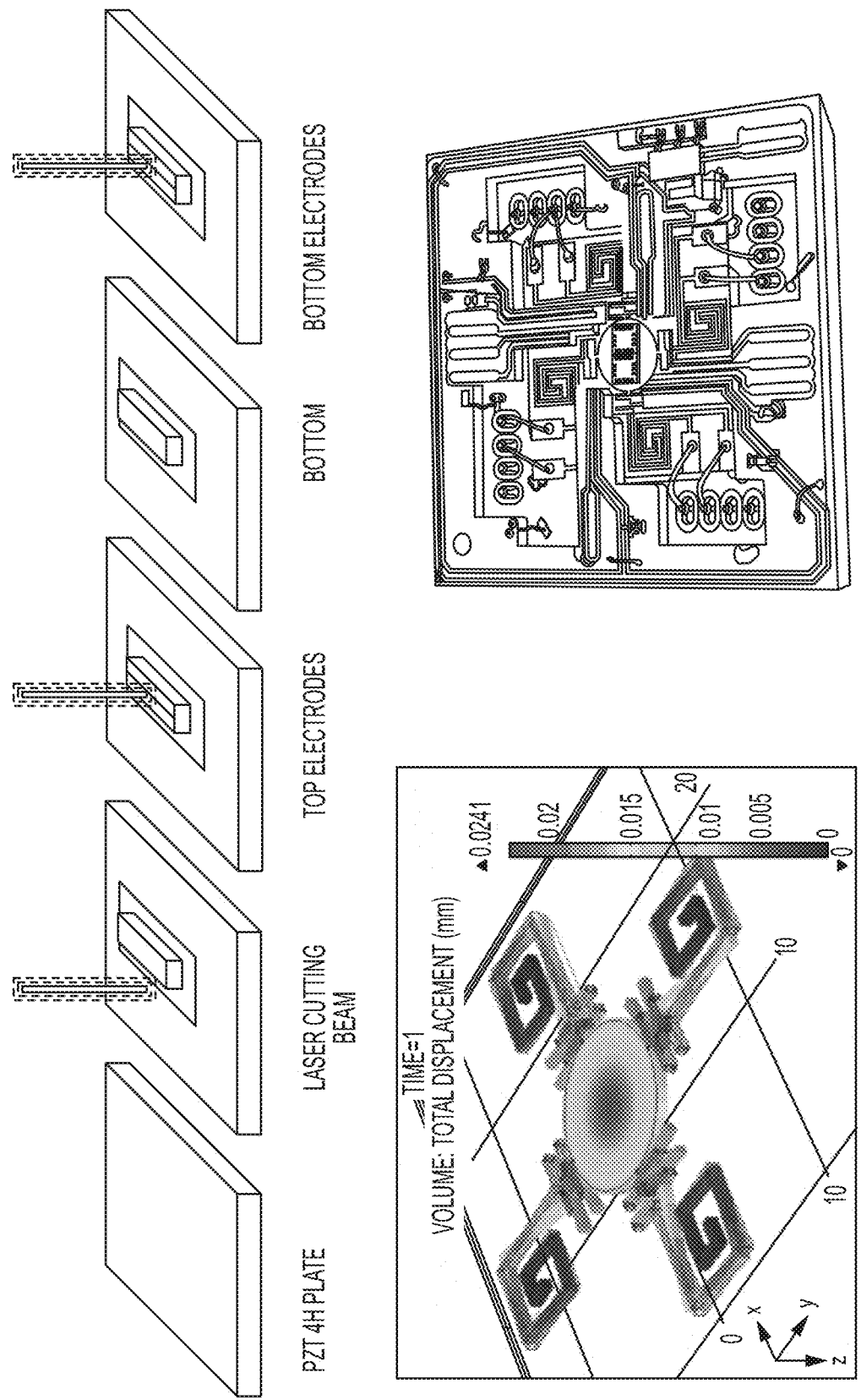
FIG. 14 is a schematic representation of a methodology for bulk PZT lateral bimorph based actuators, in accordance with an embodiment.

Precision gripper assembly tool: According to an embodiment, FIG. 14 depicts a PZT cutting process used to realize the gripper structure. PZT is laser cut to define beams and cantilevers, and also integrate lateral bimorphs which allow bimorph motion with voltages applied on two electrodes on the same bimorphs. By making a serpentine lateral bimorph series actuator around a circular stage, stages are realized that can be moved in X, Y, Z, and θ by applying different voltages on the eight electrodes formed on the four sides of the center stage.

Figure 15:
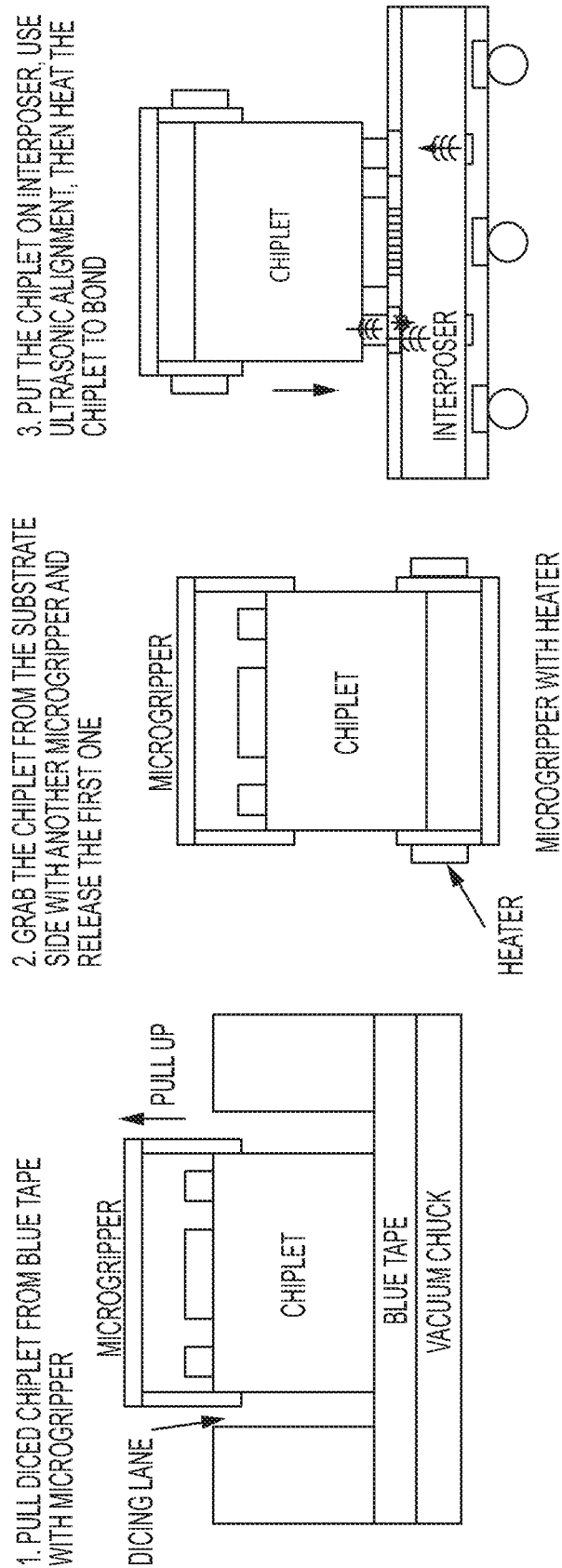
FIG. 15 is a schematic representation of a micro assembly process, in accordance with an embodiment.

The chiplet can be automatically assembled with the interface chip by using a precision gripper which is actuated by PZT stage. FIG. 15, first panel, shows a photograph of the stage which can be used as fine position control with range 10 μm stage size is 25.4 mm×25.4 mm. FIG. 15, second panel, shows a gripper which consist of two sets of a precision stage, and ultrasonic horn. FIG. 15, third panel, shows steps to assemble diced chiplets and interconnect chip in the four following steps. First, the gripper coarse position is controlled by a xyz stage that the tweezer is attached to. Fine position control is controlled by PZT stage with closed loop feedback from piezoresistive sensors integrated onto silicon arms. After the gripper reaches the chiplet position, two stages lower the tip next to the chiplets until the tips touch the wafer. Strain gauges in the two handles confirm the touch and stop tips height movement. Second, the PZT block send ultrasonic through the tips which are also ultrasonic horn. The ultrasound is amplified by the horn geometry and sent to the chiplet in order to pull out from the blue tape. Third, another gripper grab chiplet edge. The second gripper rotates by 180 degrees. The first gripper grabs the upside down chip. Fourth, the gripper places the chiplet at the correct position on the interposer chip.

Feasibility of Adhesive Bonding SIC and Chiplet:

One possible concern is whether or not it is possible for GHz ultrasonic waves to propagate through a reasonably thick adhesive layer and through the thickness of multiple chips, as is the case for transmitting and receiving acoustic waves with the SIC. In previous experiments it was shown that it is possible to transmit and receive GHz ultrasonic pulses through silicon dies that are bonded back to back with a cyanoacrylate adhesive layer, as can be seen in FIG. 16, with signal levels that are not much different than if the adhesive layer were not there.

Figure 16:
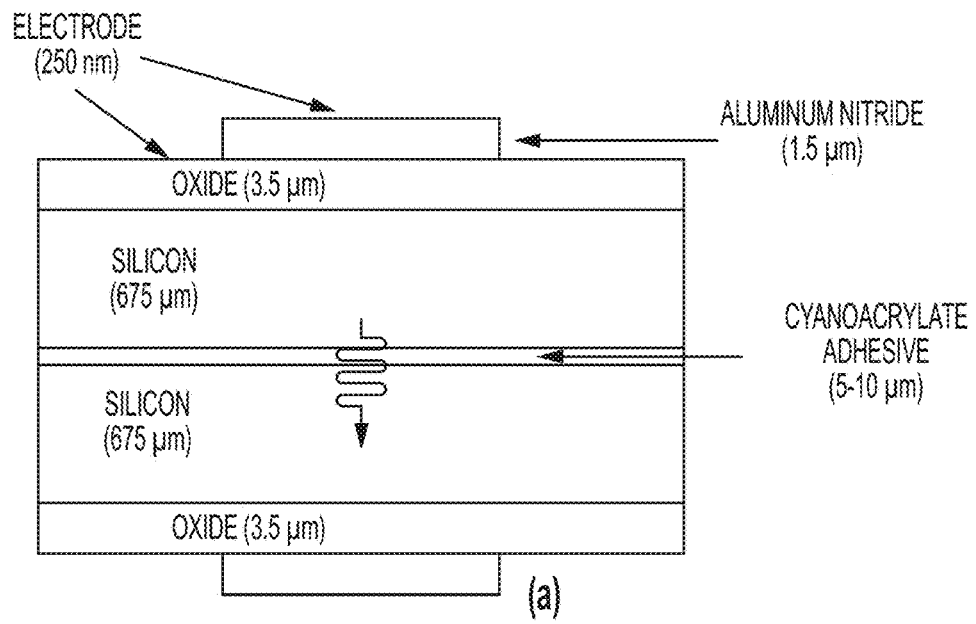
FIG. 16 is a schematic representation of a sonic through silicon via (TSV) experiment, in accordance with an embodiment.
Figure 16:
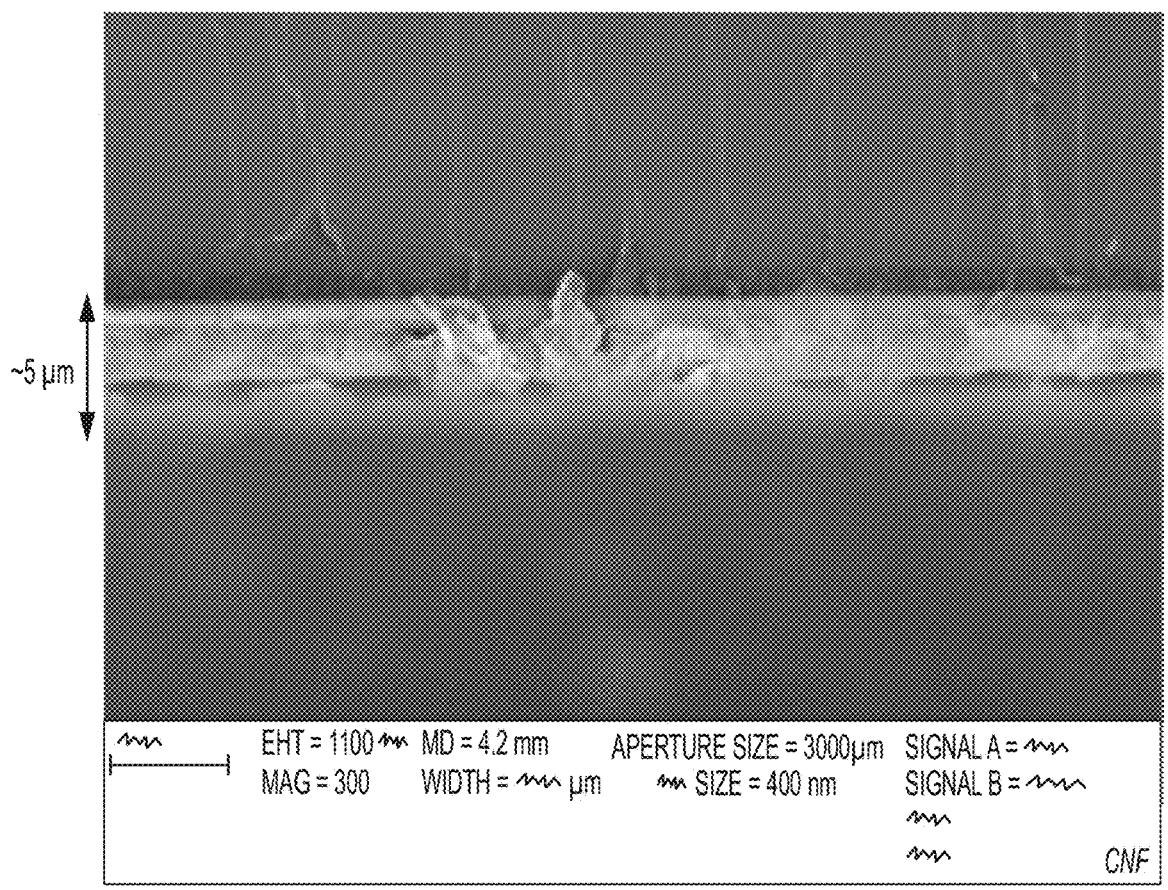
Figure 16:
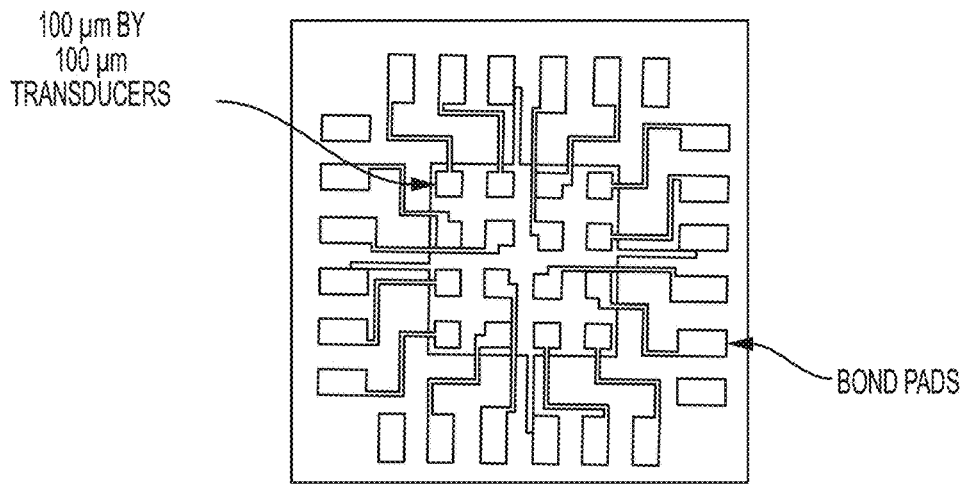
Figure 16:
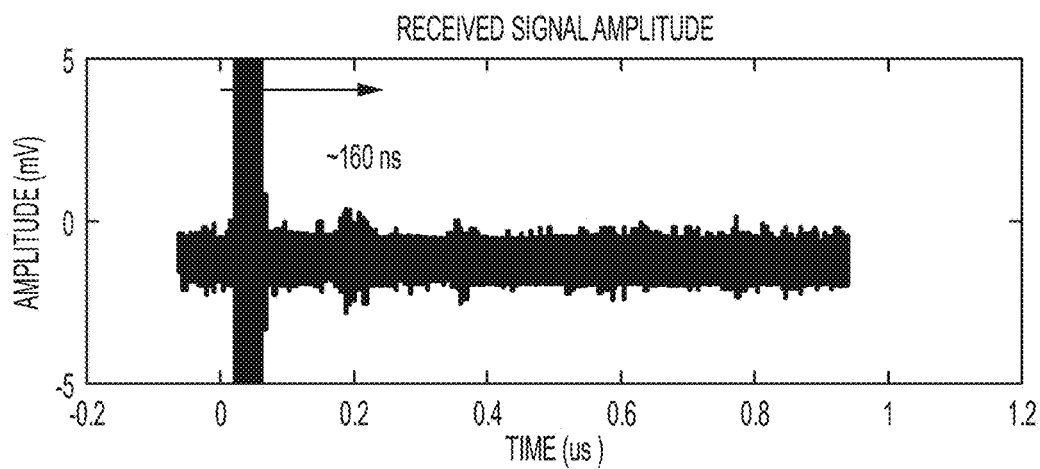
Figure 16:
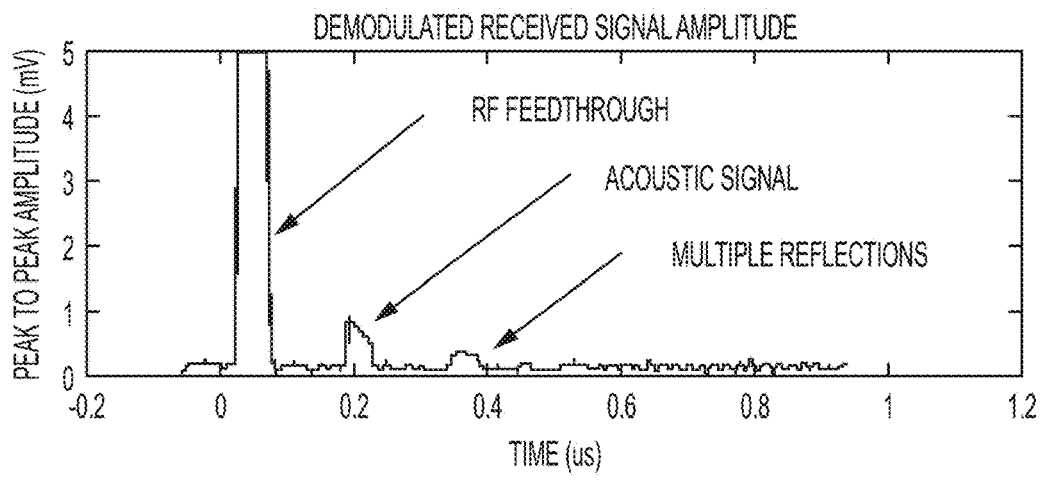

Referring to FIG. 16, in one embodiment, are sonic through silica via (TSV) experiments. In FIG. 16(a), two dies are bonded back to back with a 5 μm thick layer of adhesive and ultrasound is transmitted through the thickness of the stack with AlN transducers. In FIG. 16(b) is SEM of the adhesive layer. In FIG. 16(c) are transducers used for the sonic TSV. In FIG. 16(d) are received voltages for the sonic TSV channel. Received signal amplitudes have since been increased by improved transducer design.

Electrospray of Polymer and Assembly Process Picture:

During the alignment process, each of the pads and sonic alignment marks will transmit ultrasonic pulses, which will encounter the sonic impedance alignment-mark of the chip to be attached. Once the sonic response has been measured and maximized, corresponding to the pad-to-pad and alignment mark-to-alignment mark contact, the pad temperature can be raised by integrated resistive heating. The resistive heating raises the electro-sprayed thin film of vaporizable polymer above its glass transition temperature. The polymer becomes tacky, enabling bonding between the two surfaces, which is enhanced by the presence of micro-grooves trapping the liquid polymer and increasing surface area of adhesion. If the chip is to be removed, one has to heat the chip to the decomposition temperate of the polymer, vaporizing the bonding polymer and releasing the micro-part. Many different polymers can be used for this task. These polymers, along with their glass transition ($T_g$) and decomposition (Td) temperatures are included in the table below. The ultrasonic absorption of the material is also important as too much absorption reduces the energy transmitted across the interface. However, given the values of absorption in the table, for a 10 μm thin films, at 1-GHz, there is a 1-3 dB loss. Since with electrospray one can get even thinner films, lower losses are anticipated.

TABLE 3

| Polymer Name | Tg (C) | Td (C) | α absorption (db/GHz*μm) |
|---|---|---|---|
| Polypropylene Carbonate (PPC) | 40 | 250 | 0.364 |
| PPC with Photo-acid Generator (PPC + PAG) | 40 | 136 | — |
| Cornell Vaporizable Polycarbonate (CVPC) | 103 | 218 | 0.498 |
| CVPC with Photo-acid Generator (CVPC + PAG) | 103 | 138 | — |
| PPC (70%) + CVPC (30%) with Thermal-acid | 40/103 | 165 | — |
| Poly(methyl methacrylate) (PMMA) | 105 | 375 | 0.108 |

According to an embodiment, PPC and CVPC are chosen due to their low temperature sublimation, reasonable glass transition temperature, and ability to degrade without charring. PMMA is selected as a higher operating temperature alternative with the downside of potential charring upon degradation. Addition of acid producing additives can be used to tune decomposition temperatures. Mixing polymers may be of benefit to yield improved properties. For example, the PPC+CVPC mixture has the benefit of reduced decomposition temperature from the CVPC but the workability due to lower glass transition temperature of the PPC. The VAPR program has documented the benefits of this type of mixture.

Figure 17:
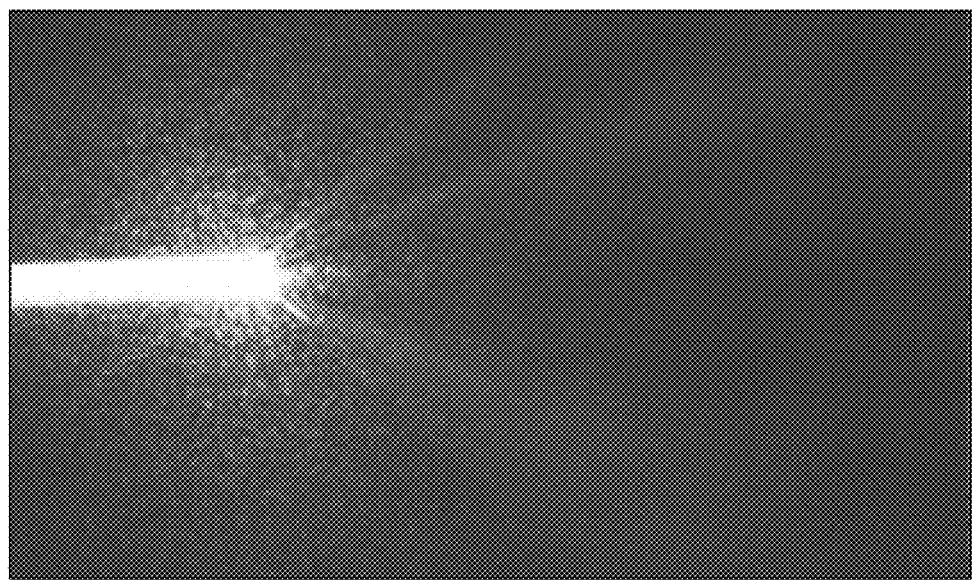
FIG. 17 is a schematic representation of electrospray, in accordance with an embodiment.
Figure 17:
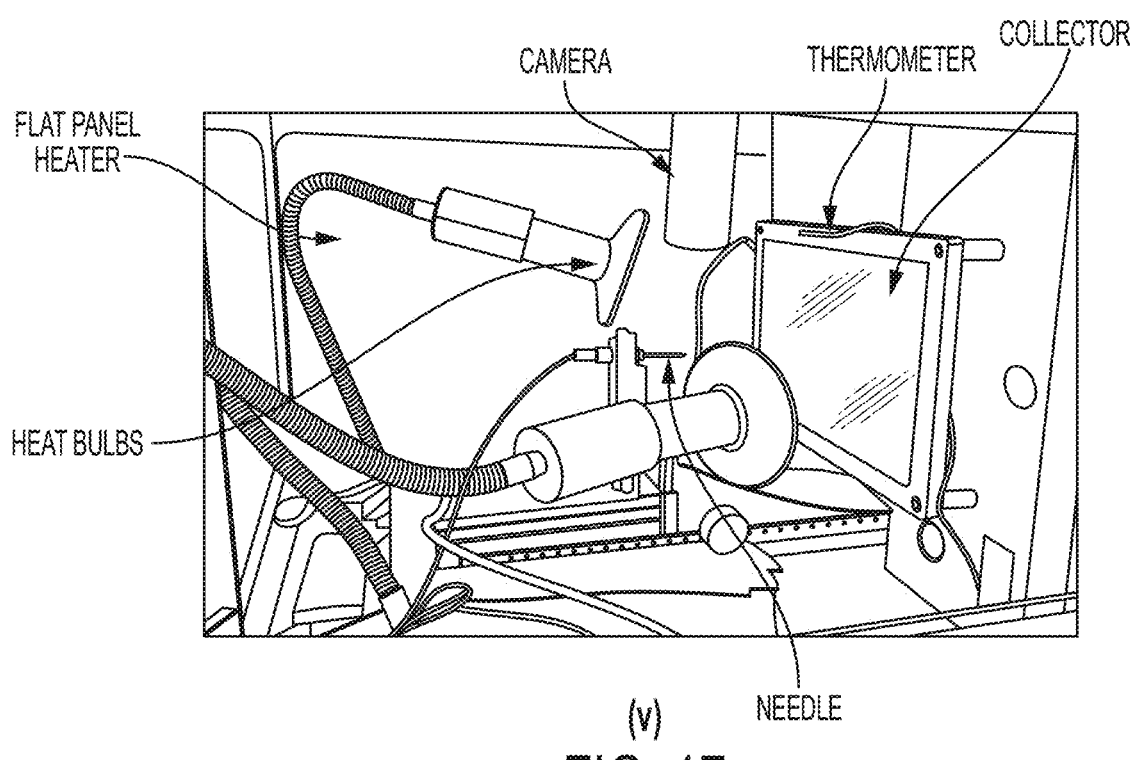
Figure 17:
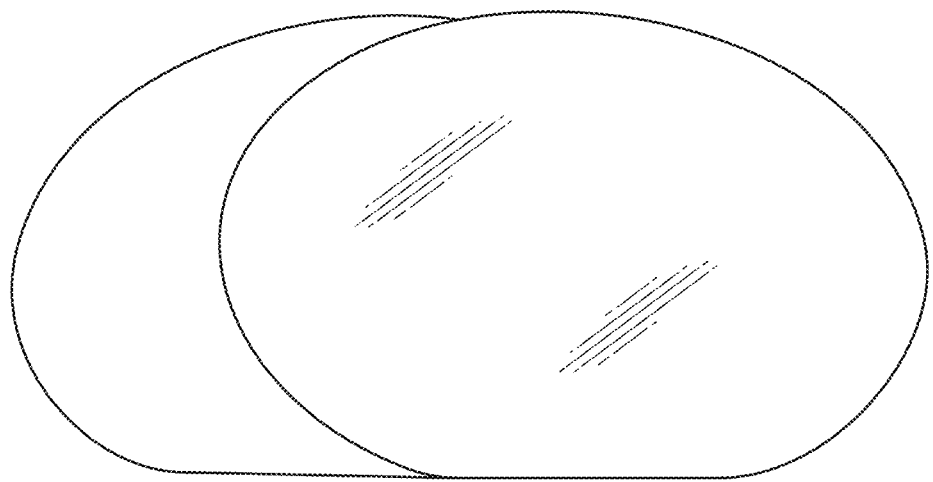
Figure 17:
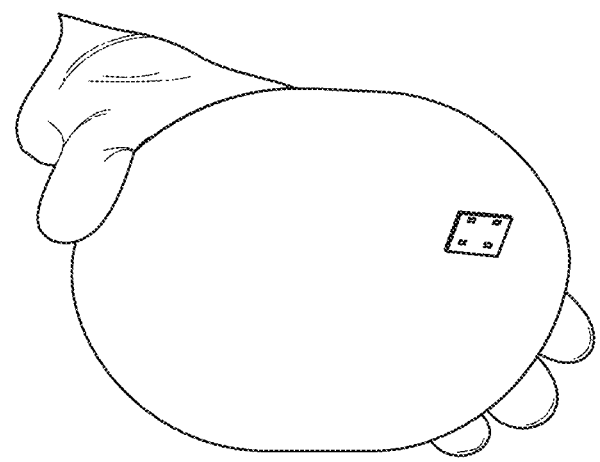

Referring to FIG. 17 is a description of electrospray. In FIG. 17(a) is an electrospray tip emitting polymer without solvent. In FIG. 17(b) is an electrospray setup with optical feedback for thin film deposition. In FIG. 17(c) is a clean silicon wafer on top of silicon wafer with electrospun PPC (Poly-Propylene Carbonate) polymer coating. In FIG. 17(a) is an example of a 5×5 mm chip adhered to wafer with PPC coating after heating to 60° C. and held perpendicular to the lab bench showing successful bonding.

According to an embodiment is a an electrospinning (ES) process that can spray polymers into thin films uniformly onto small substrates. The ES process allows the solvent in the polymer to evaporate leaving only solid polymer thin films. It is possible, for example, to achieve films as thick as 250 mm in a few hours, but only 10's of micrometers thick films are required for bonding. Using this ES approach, one can easily control film thicknesses to deposit the desired amount.

According to an embodiment is an electrospun PPC polymer coating deposited over 15 min onto a silicon wafer and successfully bonded a 5×5 mm chip to the surface using 60° C. and slight pressure, as shown in FIG. 17. This bond is strong enough to allow the system to be turned upside down and remain bonded under gravity as well as slight mechanical disturbances by hand. When heated to 250° C. the polymer decomposes to vapor and the chip is freed.

Digital Test Vehicle:

According to an embodiment is a digital test vehicle to demonstrate the proposed sonically enabled testing methodology. The digital test vehicle should be complex enough to facilitate multiple real-world testing scenarios, yet at the same time, simple enough to meet the aggressive design timeline of the project and small enough to fit within the area budgets mentioned earlier in the proposal. Given these goals, a RISC-V embedded microcontroller can serve as the digital test vehicle. RISC-V is an open instruction set which is attracting significant interest across industry, academia, and the DoD, and meets the CHIPS program's preference for open IP. More specifically, one can use the RV32IM instruction set which is a 32-bit instruction set suitable for baremetal, low-performance, low-power applications.

Figure 18:
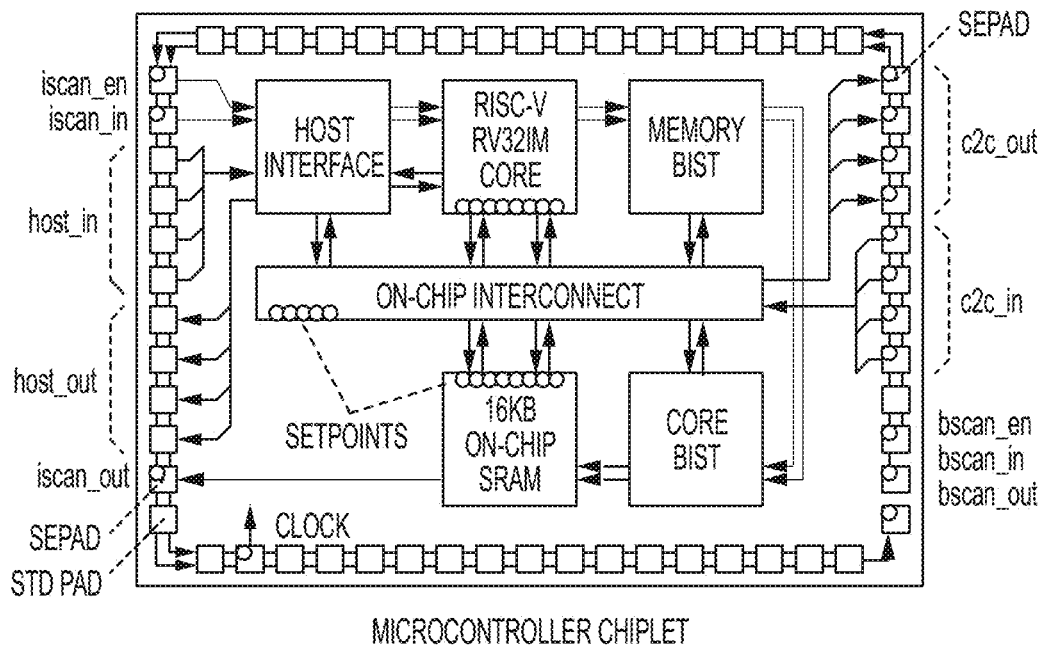
FIG. 18 is a schematic representation of a digital test vehicle, in accordance with an embodiment.
Figure 18:
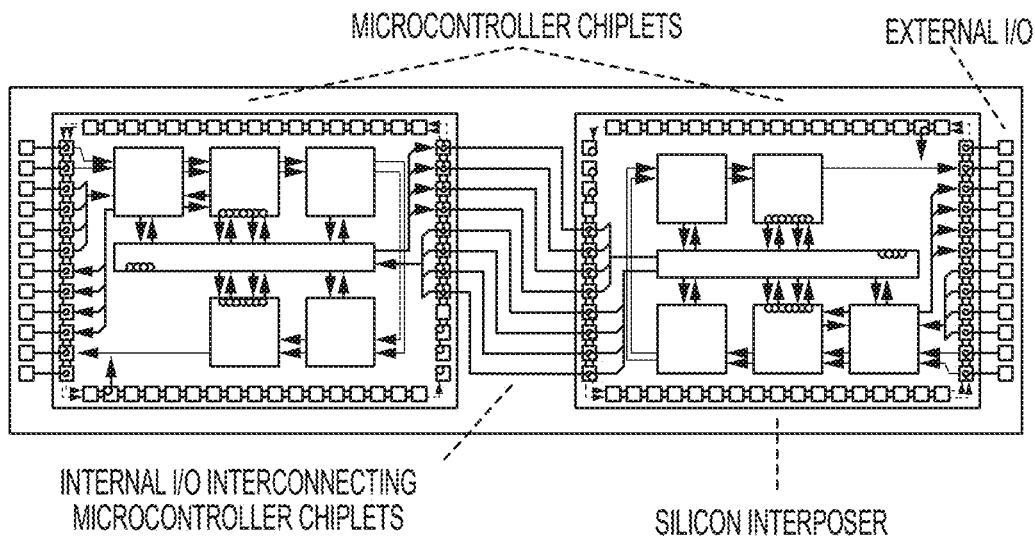

FIG. 18(a) sketches the proposed microcontroller chiplet. Referring to FIG. 18 is a schematic representation of a digital test vehicle. In FIG. 18(a), a RISC-V microcontroller chiplet enables demonstration of SEPADS for boundary scan testing, internal scan testing, memory BIST, processor BIST, and at-speed probing. In FIG. 18(b), two microcontroller chiplets can be composed on a silicon interposer to create a test vehicle for demonstrating SEPADs within a full system. The RISC-V RV32IM core can be connected to 16 KB of on-chip SRAM with dedicated ports for both instruction and data access. The microcontroller chiplet can use an off-chip clock generator and operate at a modest clock frequency. A host-interface is included to enable an off-chip controller to load a microcontroller application into the on-chip SRAM and/or interact with basic peripherals through a robust asynchronous interface. One can add five testing mechanisms: (1) boundary scan for testing inter-chip I/O; (2) internal scan for testing various on-chip subsystems; (3) BIST for testing the on-chip SRAM; (4) BIST for testing the RISC-V RV32IM core; and (5) at-speed internal probing of the core, interconnect, and/or SRAM.

Scan testing is an effective way to perform initial low-level post-silicon debug. At design time, a selection of standard registers are replaced with scan registers. Each scan register has two additional inputs: scan input and scan enable. The output of each scan register is connected to the scan input of the next scan register forming a long shift register spanning most of the chip. When the scan enable signal is low, the scan registers behave as standard registers, but when the scan enable signal is high, data is shifted from one scan register to the next, one cycle at a time. The input and the output of the scan chain are usually connected to external pins of the chip such that an external tester can: (1) shift data into the scan registers, (2) execute some number of cycles of normal operation, and (3) shift data out of the scan registers to compare to the reference outputs. FIG. 18(a) illustrates the two kinds of scan testing which can be included in a microcontroller chiplet.

Boundary scan is used with scan registers located next to each external I/O pin of the chiplet, and it enables setting each external pin output to a predefined value and capturing each external pin input. Boundary scan enables testing chiplet output circuitry/pads by first scanning in predefined data and then sampling the corresponding pins using an external tester to ensure the correct data has been transmitted. Similarly, boundary scan enables testing chiplet input circuitry/-pads by driving these pins from an external tester, sampling the corresponding pins from within the chiplet, and scanning out the data for verification.

Internal scan is used to test various subsystems within the chiplet (e.g., host interface, register file, integer multiplier). Boundary and internal scan will each use three external pins (i.e., scan enable, in, out) and these external pins will be SEPADs to enable the sonic testing methodology.

Built-in self-testing (BIST) is a more advanced way to perform higher-level post-silicon debug. BIST involves integrating additional test logic onto the chiplet to generate input test vectors, capture output test vectors, and then compare the output test vectors to reference vectors. FIG. 18(a) illustrates two kinds of BIST which can be included microcontroller chiplet.

Memory BIST is used to test the on-chip SRAM separately from the RISC-V RV32IM core. Note that commercial SRAM IP often includes BIST for testing just the low-level SRAM array itself. One can also or alternatively implement a memory BIST which tests the low-level SRAM array and also the additional logic around the SRAM for communication, partial accesses, and arbitration. According to an embodiment, the memory BIST subblock will be able to generate a sequence of pseudo-random memory requests, receive the corresponding memory responses, and then compare these responses to reference memory responses stored in an on-chip ROM.

Core BIST is used to test the RISC-V RV32IM core separately from the on-chip SRAM. The core BIST is essentially a small predefined test program consisting of instructions and data stored in a ROM and mapped into a portion of the RISC-V RV32IM core's memory address space. Both the memory and the core BIST are controlled using the same internal scan mechanism described above. Signals to enable BIST can be scanned into the appropriate subblocks, and signals that indicate the success or failure of the BIST can be scanned out of the appropriate subblocks. Since the internal scan is connected to SEPADs, BIST can be elegantly integrated into the sonic testing methodology.

At-speed probing involves observing signals within a chiplet during regular operation to monitor for various subtle failures. Since it is simply not possible to use an external probe to directly access signals within a chiplet, traditional at-speed probing mechanisms usually integrate a custom "logic analyzer" on-chip which samples a moderate number of signals for 10 s to 100 s of cycles and stores this data to an on-chip memory. The contents of this logic analyzer memory can then be scanned out of the chip for analysis. SETPOINTS enables true at-speed probing of internal signals. The system may implement passive SETPOINTS within the core, interconnect, and/or SRAM. For example, adding SETPOINTS to the outputs of the core's program counter can be performed. This would enable at-speed observation of which instructions are executing on the core. One could also add SETPOINTS in the on-chip interconnect and SRAM to enable at-speed observation of the memory request/response transactions currently executing within each of these two subsystems.

FIG. 18(b) sketches how two microcontroller chiplets can be composed using a silicon interposer. One can extend the basic microcontroller design to include a dedicated chiplet-to-chiplet interface which enables one RISC-V RV32IM core to send memory requests to the on-chip SRAM located on the neighboring chiplet. This enables both chiplets to function as a simple dual-core shared-memory microcontroller system. Testing such a system using traditional electrical techniques can be particularly challenging. Providing external connections for each chiplet can consume significant external I/O pins, while chaining the scanning test interfaces of each chiplet to the next makes it difficult to test chiplets and/or interposer interconnect in isolation. Any failures in one chiplet or in part of the inter-chiplet interconnect can significantly reduce test controllability and observability of the full system. The sonically enabled testing methodology opens up new opportunities for testing such systems. SEPADS enable each chiplet to be tested using internal scan and BIST testing in complete isolation, and boundary scan testing enables the inter-chiplet interconnect (including the I/O circuitry/pad, microbumps, and intra-interposer wiring) to be tested in isolation and on a per-link basis. SETPOINTS also enable a particularly novel capability: non-intrusive at-speed probing of intra-chiplet signals and inter-chiplet links. For example, the chiplet-to-chiplet links in FIG. 18(b) can be probed using a sonic interrogator chip during normal operation to debug subtle and rarely occurring timing bugs or failure modes.

The systems and methods described herein offer significant advantages over existing systems. For example, the system envisions an electronics system design environment in which the cost of developing new systems is greatly reduced. The cost of current systems is greatly increased by non-recurring engineering cost of assembling and designing systems with new chips that differ significantly from past chips in both chip I/O configuration and performance in power and heat generation. In the commercial world, the NRE can be absorbed over very large market segments in electronics. In DOD applications, in contrast, the device and system counts are very low, making the NRE of advanced electronics systems prohibitive and time to development too long; this sometimes prevents soldiers from operating with the highest performing systems. To increase the speed at which new IC designs can be utilized in future DOD systems, CHIPS develops a common interface paradigms for digital and analog systems that traverses across chip generations. CHIPS develops specific I/O standards, implement them on DOD relevant chips that process digital and analog and RF data, such that future chips designed with more advanced nodes, or better performance can be replaced easily. CHIPS lead to the development of many tiny chiplets, as part of a GOTS (Government-Off-The-Shelf) supply which can be put together into complex systems.

In addition to the reduction of cost and speed of system integration for the DOD, the CHIPS program would also lead to a revolution in microsystems research in academia and start-ups, two environments where performance and innovation is high but quantities are low. One can envision a new area of research on very complex and high-value microsystems being assembled together by using tiny, easily available, chiplets from an ITAR-compliant approved set of vendors, perhaps from a well-known IC foundry service vendor such as MOSIS. This would usher in a new era of innovation in heterogeneous systems that today cannot be achieved as the cost of developing all of the components on one chip is prohibitive.

In the CHIPS paradigm, one can envision potentially multiple layers of chips stacked on top of each other, on potentially multiply ordered interposer layers. In the current IC design paradigm, much of the burden of a system working is placed on the engineering team producing the system, which in turn rely on the chip designers to provide working ICs. The yield at the end of an IC fab process is controlled by the fab run. However, with (Government Off-The-Shelf) GOTS, teams of engineers not necessarily familiar with the inner workings of the chip (which may or may not be fully tested) will be required to make systems work. Furthermore, the systems team has to tackle the "known-good-die" problem. The chips that are actually tested on wafer in the fab are not used in multi-chip modules because the dies after test are deemed less reliable and even dangerous for state-of-art assembly tools. Hence, the chips supplied by the vendors are often untested. In the CHIPS framework, where the value of each multi-chip module is high, losing an entire system because of die failure and not knowing where the failure is can be very costly.

In industry, where the volumes can be very high, loss of modules is not relevant. It would be much better to test each chip's functionality as it is being placed on the chip-stack. In this scenario there will be much circuit-level debugging to be done, in terms of measurement of timing and voltage amplitudes of analog and digital signals. In order to address this problem, it is proposed to develop a method to read voltages from I/O pads that are facing down, bonded to another chip, after the assembly process without using electrical conductors. It is also proposed to use ultrasonic communications and energy transfer. Furthermore, this same method can be used to apply voltages to a pad buried within several layers of bonded chips.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A system, comprising:
    an interposer layer;
    a circuit layer positioned on the interposer layer and electrically coupled to the interposer layer, the circuit layer comprising a plurality of sonically-enabled pads; and
    an interrogator layer positioned on the circuit layer and comprising a plurality of ultrasonic transducers configured to sonically interrogate the circuit layer;
    wherein the sonically-enabled pads are configured to generate an electrical signal in response to sonic interrogation from the interrogator layer, if the sonically-enabled pad is functional.

2. The system of claim 1, wherein the plurality of ultrasonic transducers are aluminum nitride piezoelectric transducers.

3. The system of claim 1, wherein the interrogator layer is configured to test one or more of the plurality of sonically-enabled pads by sonically interrogating the circuit layer.

4. The system of claim 1, wherein the interrogator layer is configured to monitor one or more of the plurality of sonically-enabled pads by sonically interrogating the circuit layer.

5. The system of claim 1, wherein at least some of the plurality of ultrasonic transducers form a phased array.

6. The system of claim 1, wherein at least some of the plurality of pads comprise a sonically-enabled test point.

7. The system of claim 1, wherein the plurality of sonically enabled pads comprise integrated circuitry.

8. The system of claim 1, wherein the sonic interrogator is attached to the circuit layer using a thin-film attachment.

9. The system of claim 1, wherein the thin-film attachment is adhesive bonding.

10. The system of claim 1, wherein the sonic interrogator is reversibly attached to the circuit layer using a vaporizable polymer.

11. A method for testing a pad, comprising:
    providing an interrogator layer positioned on a circuit layer comprising a plurality of sonically-enabled pads, the interrogator layer comprising a plurality of ultrasonic transducers configured to sonically interrogate the circuit layer;
    sonically interrogating the circuit layer; and
    monitoring one or more of the sonically-enabled pads for an electrical signal generated in response to the sonic interrogation, wherein a generated electrical signal indicates that a sonically-enabled pad is functional.

12. The method of claim 11, further comprising the step of attaching the sonic interrogator to the circuit layer using a thin-film attachment.

13. The method of claim 12, wherein the thin-film attachment is adhesive bonding.

14. The method of claim 11, further comprising:
    attaching the sonic interrogator to the circuit layer using a vaporizable polymer; and
    heating the vaporizable polymer to at least the vaporizing temperature to vaporize the polymer and separate the sonic interrogator and the circuit layer.

15. The method of claim 11, wherein the plurality of ultrasonic transducers are aluminum nitride piezoelectric transducers.

16. The method of claim 11, wherein at least some of the plurality of ultrasonic transducers form a phased array.

17. The method of claim 11, wherein at least some of the plurality of pads comprise a sonically-enabled test point.

18. A system, comprising:
    a circuit layer comprising a plurality of alignment elements configured to respond to sonic interrogation; and
    an interposer layer comprising a plurality of ultrasonic transducers, at least some of the plurality of ultrasonic transducers positioned to align with a respective one of the plurality of alignment elements when the circuit layer is properly aligned;
    wherein the interposer layer is configured to: (1) sonically interrogate the circuit layer during alignment of the circuit layer; and (2) facilitate alignment by detecting a response of one or more of the alignment elements to the sonic interrogation.

19. The system of claim 18, wherein the response of an alignments element is minimized when the alignment element and a transducer of the interposer layer are aligned.

20. The system of claim 18, wherein the plurality of ultrasonic transducers are aluminum nitride piezoelectric transducers.

21. An alignment method, comprising:
providing an interrogator layer positioned respective to a circuit layer comprising a plurality of alignment elements configured to respond to sonic interrogation, the interrogator layer comprising a plurality of ultrasonic transducers configured to sonically interrogate the circuit layer, wherein at least some of the plurality of ultrasonic transducers positioned to align with a respective one of the plurality of alignment elements when the circuit layer is properly aligned;
sonically interrogating the circuit layer during alignment of the circuit layer; and
facilitating alignment by detecting a response of one or more of the alignment elements to the sonic interrogation.

22. The method of claim 21, wherein the response of an alignments element is minimized when the alignment element and a transducer of the interposer layer are aligned.

23. The method of claim 21, wherein the plurality of ultrasonic transducers are aluminum nitride piezoelectric transducers.

* * * * *